(12) United States Patent
Ogihara et al.

(10) Patent No.: US 7,928,572 B2
(45) Date of Patent: Apr. 19, 2011

(54) COMPOSITE SEMICONDUCTOR DEVICE

(75) Inventors: Mitsuhiko Ogihara, Hachioji (JP);
Hiroyuki Fujiwara, Hachioji (JP);
Masataka Muto, Hachioji (JP);
Tomohiko Sagimori, Hachioji (JP);
Tomoki Igari, Hachioji (JP)

(73) Assignee: Oki Data Corporation, Tokyo (JP)

( * ) Notice: Subject to any disclaimer, the term of this patent is extended or adjusted under 35 U.S.C. 154(b) by 846 days.

(21) Appl. No.: 11/690,907

(22) Filed: Mar. 26, 2007

(65) Prior Publication Data

US 2007/0222077 A1    Sep. 27, 2007

(30) Foreign Application Priority Data

Mar. 27, 2006   (JP) ................ 2006-085731

(51) Int. Cl.
*H01L 23/48* (2006.01)
(52) U.S. Cl. .. 257/758; 257/211; 257/760; 257/E21.627
(58) Field of Classification Search ................ 365/200; 257/E21.664, E27.048, E27.104
See application file for complete search history.

(56) References Cited

U.S. PATENT DOCUMENTS

| | | | |
|---|---|---|---|
| 6,320,214 B1 * | 11/2001 | Matsuda et al. | 257/295 |
| 6,583,446 B1 | 6/2003 | Taninaka et al. | |
| 6,787,825 B1 * | 9/2004 | Gudesen et al. | 257/278 |
| 7,759,798 B2 * | 7/2010 | Chibahara et al. | 257/758 |
| 2003/0185068 A1 * | 10/2003 | Saito et al. | 365/200 |
| 2004/0094791 A1 * | 5/2004 | Ito et al. | 257/310 |
| 2005/0023568 A1 | 2/2005 | Nishimura | |
| 2006/0238467 A1 * | 10/2006 | Hung et al. | 345/83 |
| 2008/0087928 A1 * | 4/2008 | Nagai | 257/295 |

FOREIGN PATENT DOCUMENTS

| | | |
|---|---|---|
| CN | 1501493 A | 6/2004 |
| EP | 0 878 310 A1 | 11/1998 |
| EP | 1 347 516 A2 | 9/2003 |
| EP | 1 434 269 A2 | 6/2004 |
| JP | 2004-207325 | 7/2004 |

* cited by examiner

*Primary Examiner* — Zandra Smith
*Assistant Examiner* — Tsz K Chiu
(74) *Attorney, Agent, or Firm* — Rabin & Berdo, PC

(57) ABSTRACT

A composite semiconductor device includes a substrate; a plurality of circuits formed on the substrate; one or more wiring layers each including a plurality of wiring patterns connected to circuits of the plurality of circuits, a plurality of dummy patterns electrically isolated from the plurality of circuits, and an interlayer dielectric film that is spin-coated directly onto the wiring patterns and onto the dummy patterns, and that is a spin-coated layer, the dummy patterns being formed in areas where the wiring patterns are absent and lying substantially in a plane in which the wiring patterns lie; and a semiconductor thin film layer including semiconductor device elements and disposed on an upper most surface of the one or more wiring layers. The spin-coated layer may be formed of an organic material or an oxide material.

26 Claims, 27 Drawing Sheets

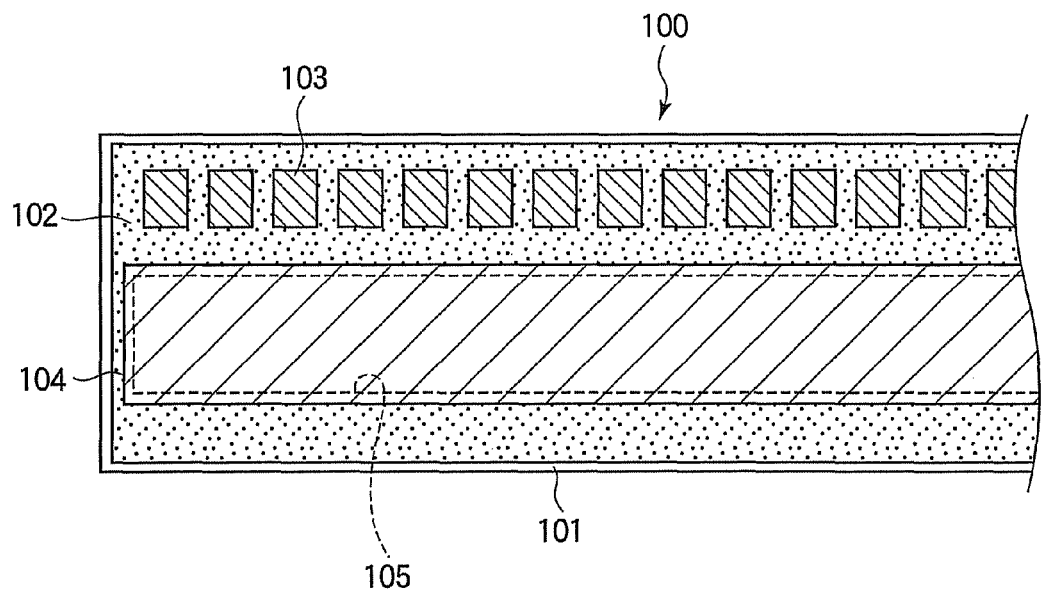
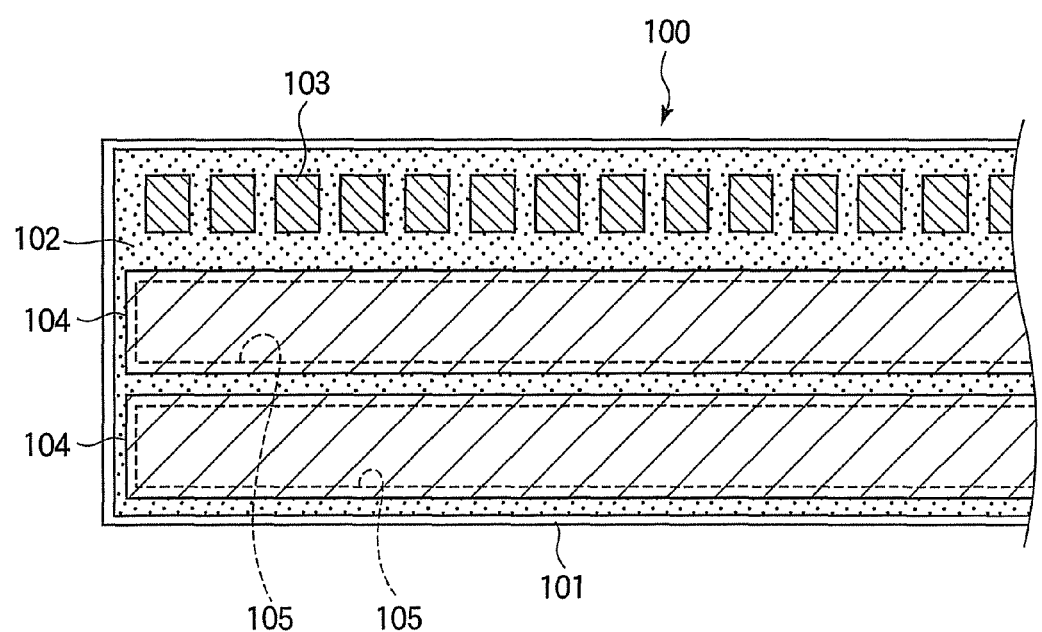

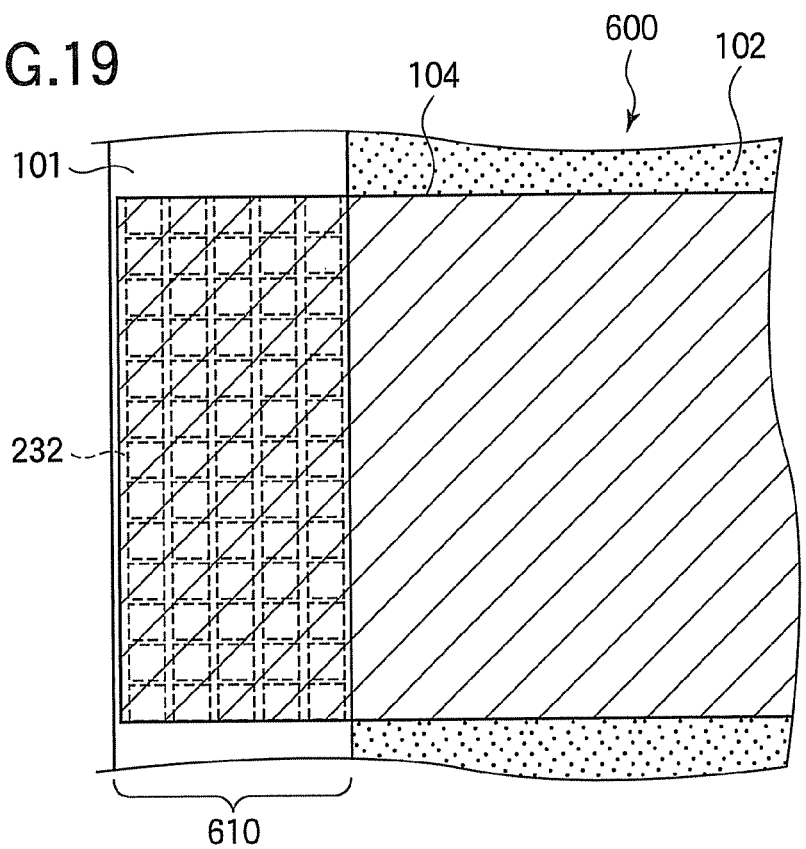
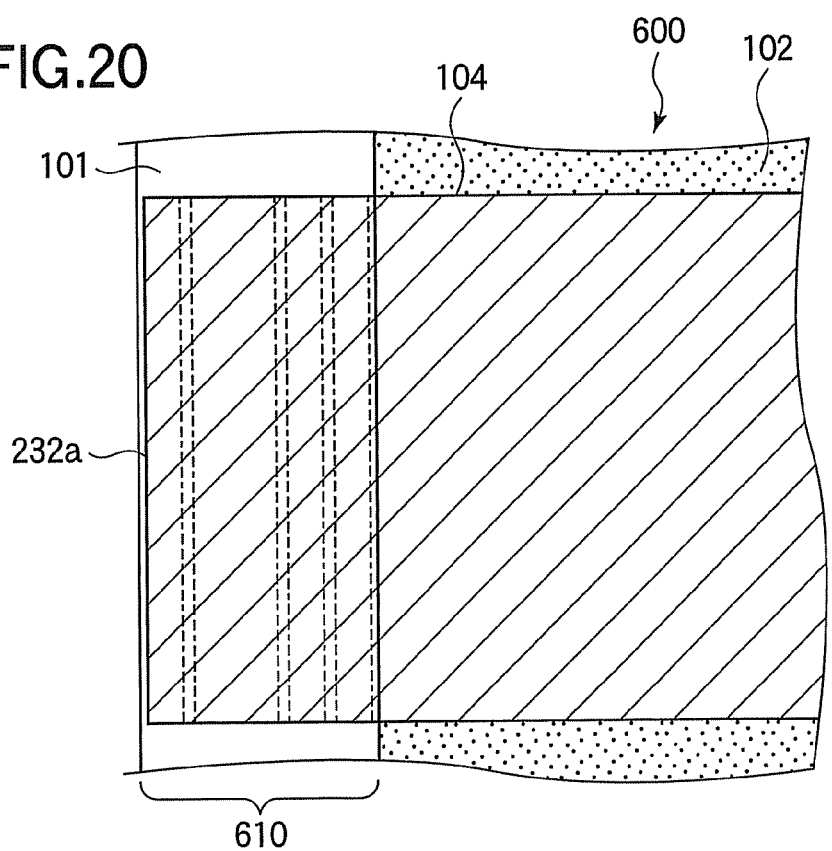

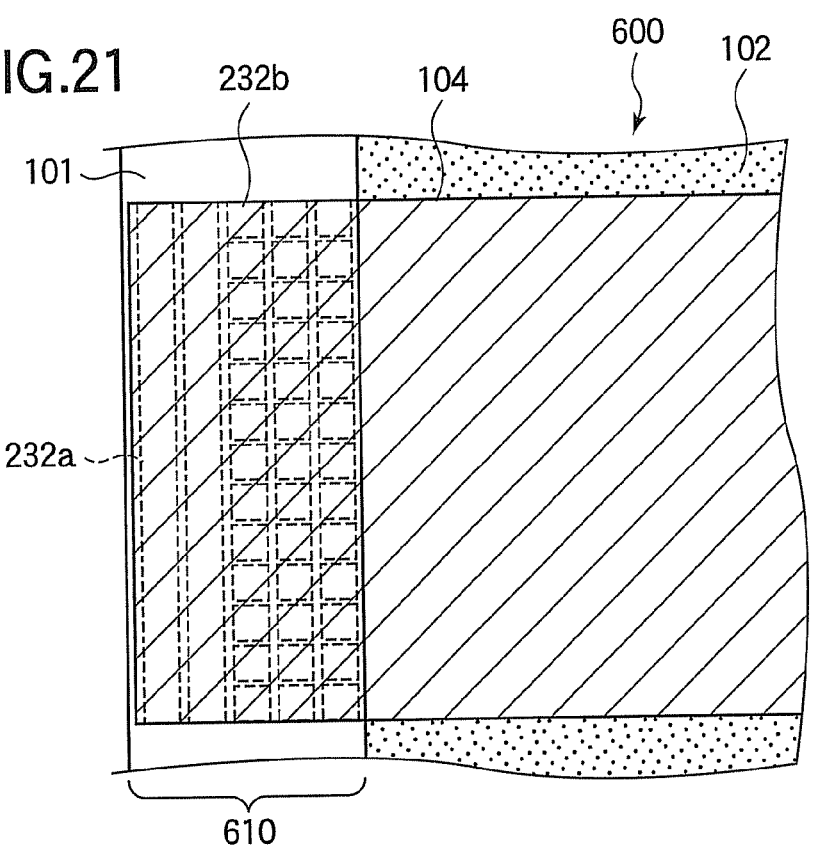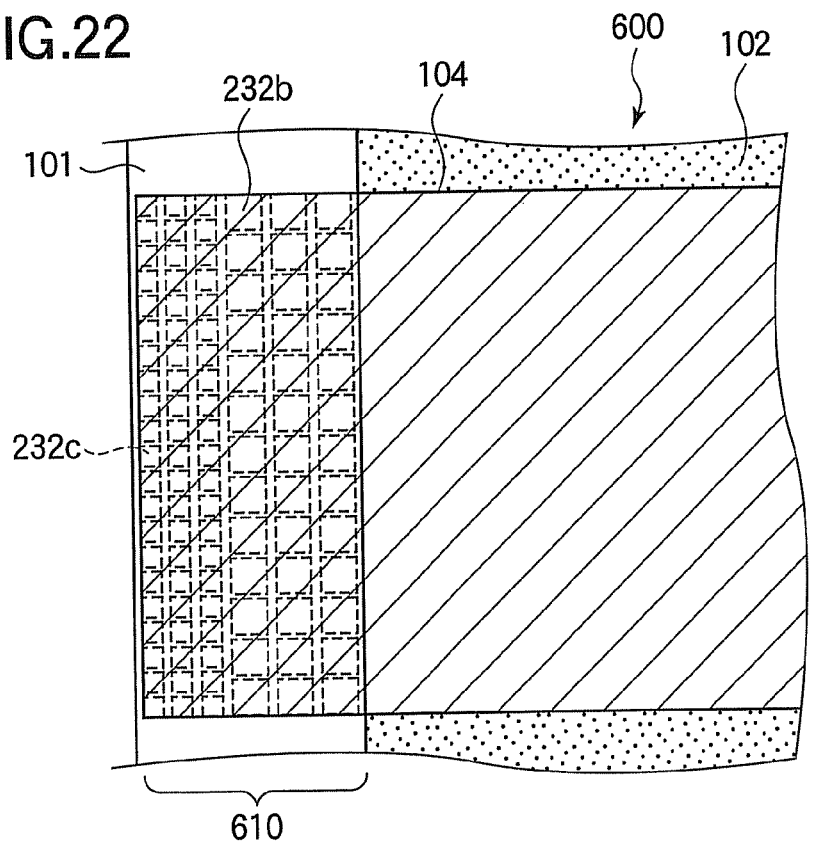

COMPOSITE SEMICONDUCTOR DEVICE

BACKGROUND OF THE INVENTION

1. Field of the Invention

The present invention relates to a composite semiconductor device in which driver circuits and elements driven by the driver circuits, an LED head that incorporates the semiconductor composite semiconductor device, and an image forming apparatus that incorporates the LED head.

2. Description of the Related Art

An electrophotographic printer incorporates an exposing unit that includes conventional composite semiconductor devices. The conventional composite semiconductor device includes a semiconductor substrate on which thin film wiring patterns are formed and the integrated driver circuits are formed on the semiconductor substrate. Thin film type LED arrays, fabricated on another substrate and released from the substrate, are bonded onto the region under which the driver circuits are not formed on the semiconductor substrate, and are electrically connected to the driver circuits via the wiring pattern.

An LED array incorporated in an LED head includes a large number of light emitting diodes (LEDs). A number of wirings are required for electrically connecting the LED arrays to the driver circuits. The LED arrays and the wirings occupy a large area outside of the area in which the driver circuits are formed. Consequently, a composite semiconductor device is difficult to be miniaturized.

SUMMARY OF THE INVENTION

The present invention was made to solve the aforementioned problems.

Another object of the invention is to increase the degree of freedom in selecting a mounting location of LED arrays on the semiconductor substrate, thereby achieving efficient utilization of space to implement miniaturization of a composite semiconductor device.

A composite semiconductor device includes a substrate, a plurality of circuits, a semiconductor thin film layer, and dummy patterns. The circuits are formed on the substrate, the circuits including one or more wiring layers. The semiconductor thin film layer includes semiconductor elements and is disposed on an uppermost surface of the wiring layers of the IC drivers. The dummy patterns are formed in an area where the wiring layers are absent in each wiring layer.

A spin-coated layer is formed between said semiconductor thin film layer and the wiring layers of the integrated circuit drivers.

The spin-coated layer is formed of an organic material.

The spin-coated layer is formed of an oxide material.

The dummy pattern is one of a plurality of dummy patterns.

The dummy pattern has a substantially same thickness as the wiring pattern thickness in each wiring layer.

An LED head includes a substrate, a semiconductor thin film, and a rod lens array. Driver circuits are formed on the substrate, and include a first wiring layer and a second wiring layer. The second wiring layer includes a wiring pattern for wiring the driver circuits on the substrate, a dummy pattern not connected to the wiring pattern and not making a circuit, and an insulating film layer that covers the wiring pattern and the dummy pattern. Light emitting elements (LEDs) are formed in the semiconductor thin film The semiconductor thin film is bonded on said substrate such that the light emitting elements are connected to driver circuits via the first wiring layer. The rod lens array focuses light emitted from the light emitting elements on the photosensitive drum.

An image forming apparatus forms an image on a recording medium, the image forming apparatus incorporating the LED head, an image bearing body, an exposing unit, and a developing section. The exposing unit illuminates a charged surface of the image bearing body to form an electrostatic latent image. The developing section develops the electrostatic latent image.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIG. 13 illustrates the smoothing region disposed closer to the center of the integrated circuit region;

FIG. 15 illustrates two smoothing regions disposed side by side on the integrated circuit region;

FIG. 19 is a partial enlarged view of the dummy patterns;

FIG. 20 illustrates a dummy pattern formed in an extended region;

FIG. 21 illustrates a modification to a dummy pattern formed in the extended region;

FIG. 22 illustrates another modification to the dummy pattern formed in the extended region;

DETAILED DESCRIPTION OF THE INVENTION

First Embodiment

Figure 1:
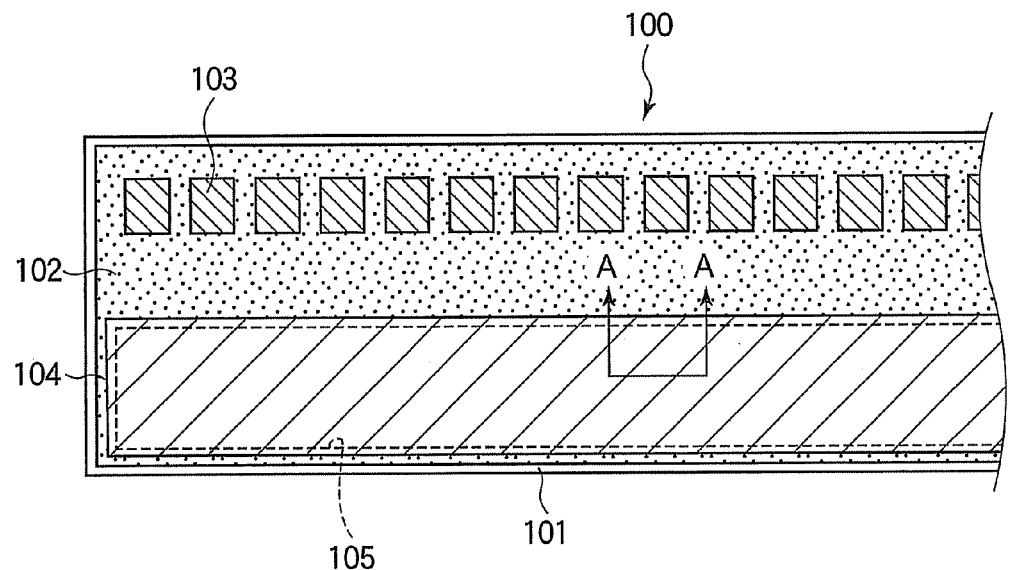
FIG. 1 is a top view illustrating pertinent portions of a semiconductor device of a first embodiment.

FIG. 1 is a top view illustrating pertinent portions of a semiconductor device 100 of a first embodiment.

Figure 2:
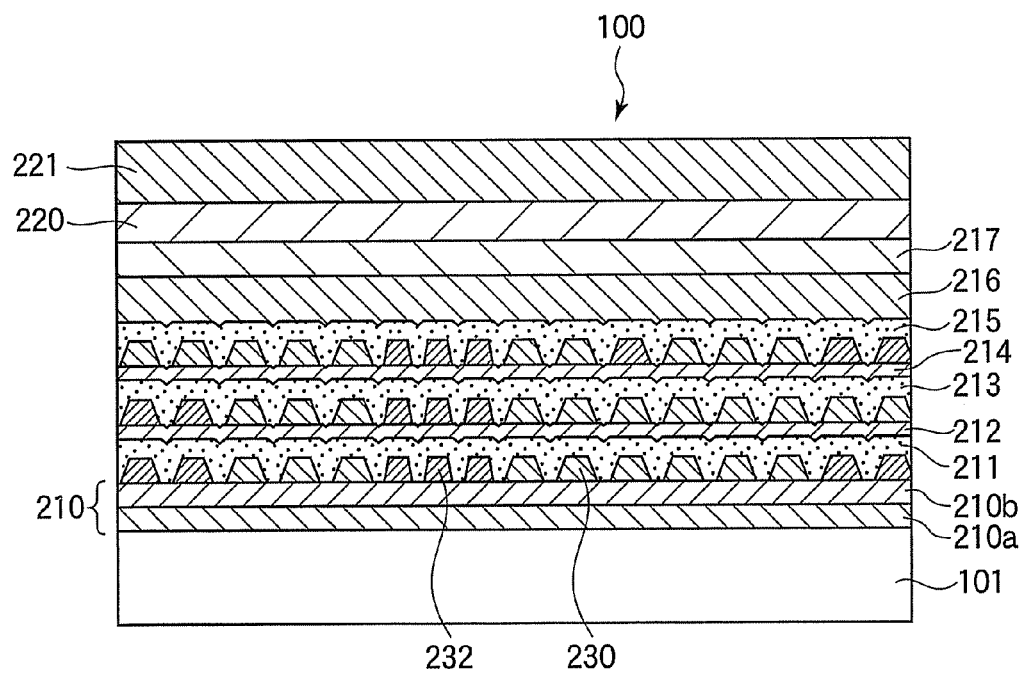
FIG. 2 is a cross-sectional view of the composite semiconductor device taken along a line A-A of FIG. 1.

FIG. 2 is a cross-sectional view of the composite semiconductor device 100 taken along a line A-A of FIG. 1.

Referring to FIG. 1, circuits are fabricated in an integrated circuit region 102 defined on an Si-substrate 101. Pads 103 are used for supplying electric power to the drive circuits and LED arrays and/or for communicating signals between the driver circuits and external circuits. A smoothing region 104 lies on the integrated circuit. A bonding region 105 supports thin-film semiconductor elements bonded thereto.

FIG. 2 diagrammatically illustrates a multilayer interconnection structure for the integrated circuits. Reference numeral 230 denotes a wiring pattern, and reference numeral 232 denotes dummy patterns for implementing a flat surface of each wiring layer of the multilayer interconnection structure of the integrated circuit. The dummy patterns 232 are not connected to any circuit. Reference numerals 210-216 denote interlayer dielectric films. A first interlayer dielectric film 210 includes an oxide film 210a such as an $SiO_2$ (thermally oxidized film) and an oxide film 210b such as an $SiO_2$ film formed by chemical vapor-phase deposition (i.e., $SiO_2$ CVD) or a sputtering film.

A second interlayer dielectric film 211 is, for example, a spin-on-glass (SOG) film or other spin-coated insulating film. A second interlayer dielectric film 212 is, for example, an oxide film and more specifically an SiO2 film (CDD film or sputtered film). Interlayer dielectric films 213-216 may be of the same configuration as the second interlayer dielectric films 211 and 212. Reference numeral 217 denotes a nitride film and more specifically, for example, a P-CVD SiN film. A wiring pattern (metallization) 230 and a dummy pattern 232 may be formed of, for example, AlSiCu, AlNi, AlTi, AlCr or Cu. Alternatively, the wiring pattern 230 may be formed of a stacked layer selected from AlSiCu, AlNi, AlTi, AlCr and Cu, or a mixed film of these materials. The surface of metal layers may be covered with Ti or TiN. Reference numeral 220 may be, for example, a spin-coated film such as an oxide film or a film of an organic material. A semiconductor thin film 221 is bonded to the top of the spin-coated film 220.

The coating layer (e.g., spin-coated layer 220 serves as a fundamental layer onto which the semiconductor thin film 221 is bonded. The coating layer may be formed by spray-coating, bar-coating, screen printing and ink-jetting; appropriate coating method may be used. Experiment reveals that the surface roughness of the spin-coated layer 220 greater than 10 nm seriously impairs bonding strength or causes a greatly reduced yield of good bonding. Therefore, the surface roughness of the spin-coated layer 220 is preferably not greater than 10 nm. Experiment also shows that the surface roughness of the spin-coated layer 220 not greater than 1 nm greatly improves bonding strength or yield of good bonding. Surface roughness is an average surface roughness over an area of 25 μm×25 μm measured with an atomic force microscope (AFM) Generally, surface roughness is an average value of peaks and valleys over a positional step not larger than 0.1 μm.

The dummy pattern 232 serves to smooth an uneven region resulting from wiring patterns, thereby providing a smooth surface of the integrated circuit drivers. The uppermost layer of the multilayer interconnection, i.e., the upper surface of the nitride film 217 in contact with the spin-coated film 220 should have a flatness not larger than 200 nm, and more preferably not larger than 50 nm. This flatness means peaks and valleys over a large positional step (e.g., 1 to 10 μm or larger) that can be measured with, for example, equipment for measuring surface roughness, and particularly overall peaks and valleys resulting from the wiring patterns, dummy patterns, grooves, and interlayer dielectric layers.

Figure 3:
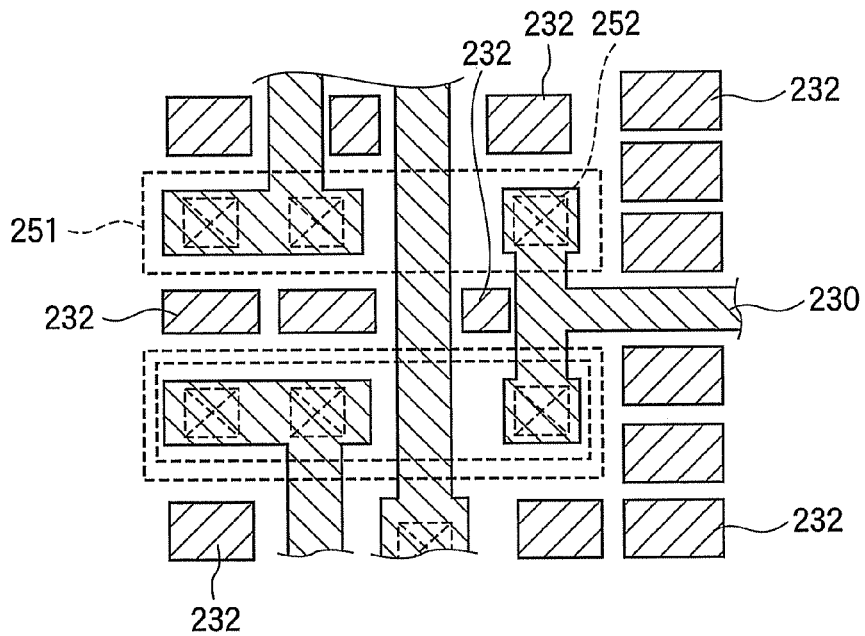
FIG. 3 illustrates the dummy pattern formed in the area of the multilayer interconnection.

FIG. 3 illustrates the dummy pattern 232 formed in the area of the multilayer interconnection. The dummy patterns are electrically isolated from the wirings in each layer.

Active regions 251 are regions in which p-type semiconductor elements or n-type semiconductor elements are formed. The wiring pattern 230 includes contact regions 252 that make electrical contact with the active region 251 or make interconnects of wirings in different wiring layers. The contact regions 252 also make electrical contact with the wirings for connecting electrodes of the semiconductor thin film bonded on the integrated circuit drivers. The dummy patterns 232 are formed at the areas where the wiring patterns 230 are not formed. The height of the dummy pattern 232 is substantially equivalent to that of the wiring pattern 230. The surface of the integrated circuit drivers is smoothed by minimizing the space among the wiring patterns using the dummy patterns and forming several dielectric layers on the wiring pattern and the dummy pattern.

Figure 4:
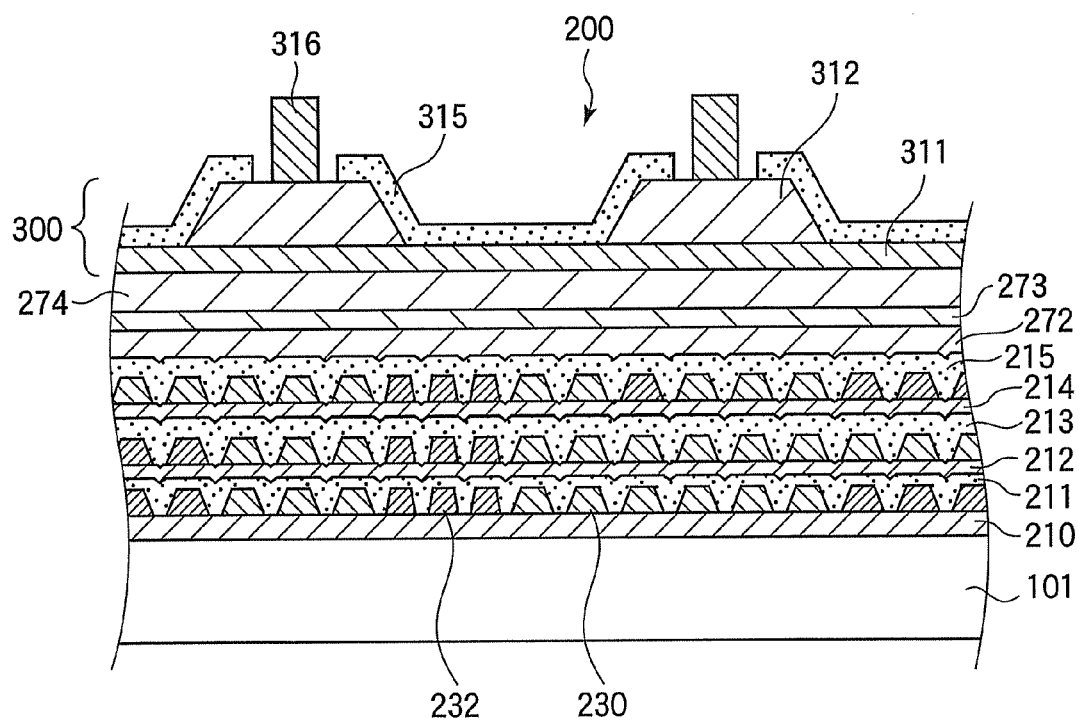
FIG. 4 is a partial cross-sectional view of a semiconductor thin film having semiconductor elements fabricated on the smoothing region formed by the dummy pattern.

FIG. 4 is a partial cross-sectional view of a semiconductor thin film having semiconductor elements fabricated on the smoothing region 104 formed by the dummy pattern 232. This cross-sectional view is similar to that in FIG. 2 taken along the line A-A of FIG. 1 and shows the cross sectional view of plural emitting regions formed in the thin semiconductor film, but differs from FIG. 2 in the structure of layers in the smoothing region 104 as follows:

Referring to FIG. 4, an Si substrate 101, the dielectric film layers 210-215 formed in each layer consisting of the multiple wiring layers, the wiring pattern 230, and the dummy pattern 232 are the same as those of FIG. 2. The structure of the wiring pattern 230 and dummy pattern 232 and the structure of the interlayer dielectric film are described as an example and may be modified. Reference numerals 272, 273, 274 and 300 denote a dielectric film layer that is an uppermost layer of the multiple wiring layers, a reflective metal layer, a layer of an organic material, and a semiconductor thin film layer, respectively. The semiconductor thin film layer has, for example, light emitting diodes.

Semiconductor elements formed in the semiconductor thin film will be described with respect to light emitting diodes as an example. However, the semiconductor elements may be other elements such as light receiving elements and sensor elements. The reference numeral 311 denotes a semiconductor layer that includes a contact layer of first conductive type having a surface in which an electrode contact of first conductive type may be formed FIG. 4 illustrates the semiconductor layers 311 and 312 after light emitting elements have been formed in the surface of the layer.

The semiconductor thin film layer 300 has a single layer structure formed of a compound semiconductor in Group III-V or a nitride semiconductor in Group III-V, or a multilayer structure of these semiconductors.

Compound semiconductors in Group III-V include GaAs, $Al_xGa_{1-x}As$, $Al_xGayAs_{1-x-y}P$, and $Al_xGa_yIn_{1-x-y}P$. Nitride semiconductors in Group III-V include GaN, $AlGa_{1-x}N$, $Ga_xIn_{1-x}N$, $GaAs_{1-x}N_x$, $GaP_{1-x}N_x$, $InAs_{1-x}N_x$, $InP_{1-x}N_x$, $InGa_{1-x}As_{1-y}N_y$, $InP_{1-x-y}AsxNy$, $GaP_{1-x-y}AsN_y$, and $In_xAl_{1-x}N$, where x and y are in the range of $1 \geq x \geq 0$ and $1 \geq y \geq 0$ The semiconductor thin film layer 300 may also take the form of a semiconductor containing Si (e.g., single crystal Si thin film, polycrystalline Si thin film, or amorphous Si thin film) or an oxide semiconductor (e.g., ZnO). The semiconductor elements formed in the semiconductor thin film layer 300 will be described later in more detail. An interlayer dielectric film 315 takes the form of, for example, SiN or $SiO_2$. Reference numeral 316 denotes an electrode of second conductive side.

Figure 5:
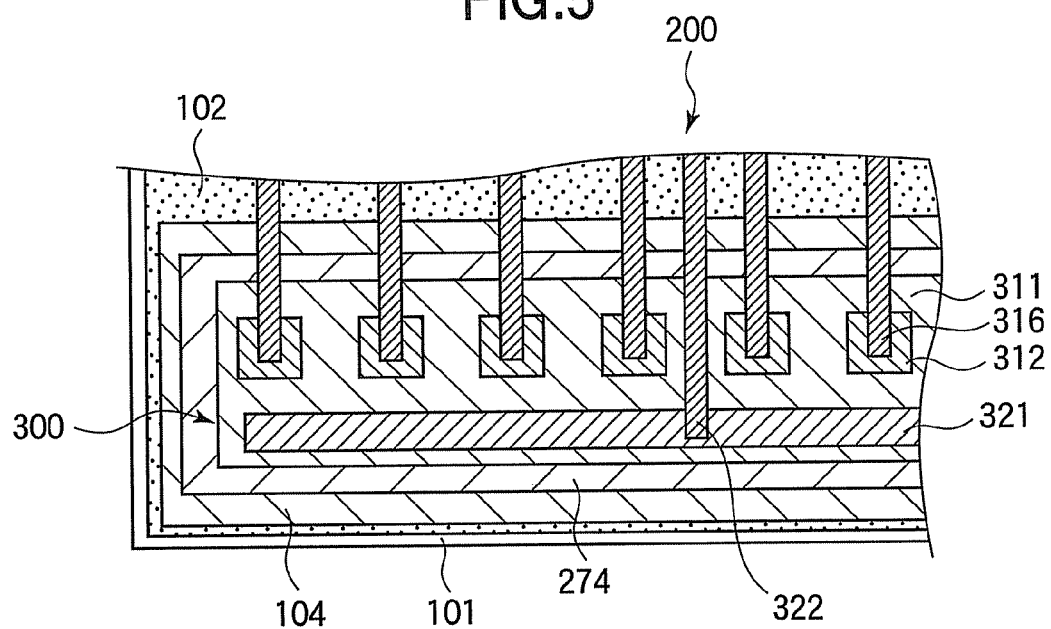
FIG. 5 is a top view of a composite semiconductor device incorporating the semiconductor thin film layer having a smoothing region in the circuit region.

FIG. 5 is a top view of a composite semiconductor device 200 having the structure shown in FIG. 4 as its cross sectional view. FIG. 5 shows an example of the structure of the semiconductor thin film that is bonded on the smoothing region on the integrated circuit drivers. The semiconductor thin film layer 300 takes the form of a light emitting element array. Elements in FIG. 5 equivalent to those in FIGS. 1 and 4 are been given the same reference numerals as those in FIGS. 1 and 4.

Reference numeral 322 denotes an electrode contact formed in a contact layer of first conductive type of a semiconductor layer 311 in the semiconductor thin film layer 300. Reference numeral 322 denotes a wiring of first conductive type connected to the electrode contact 321 of the first conductive side.

Figure 6:
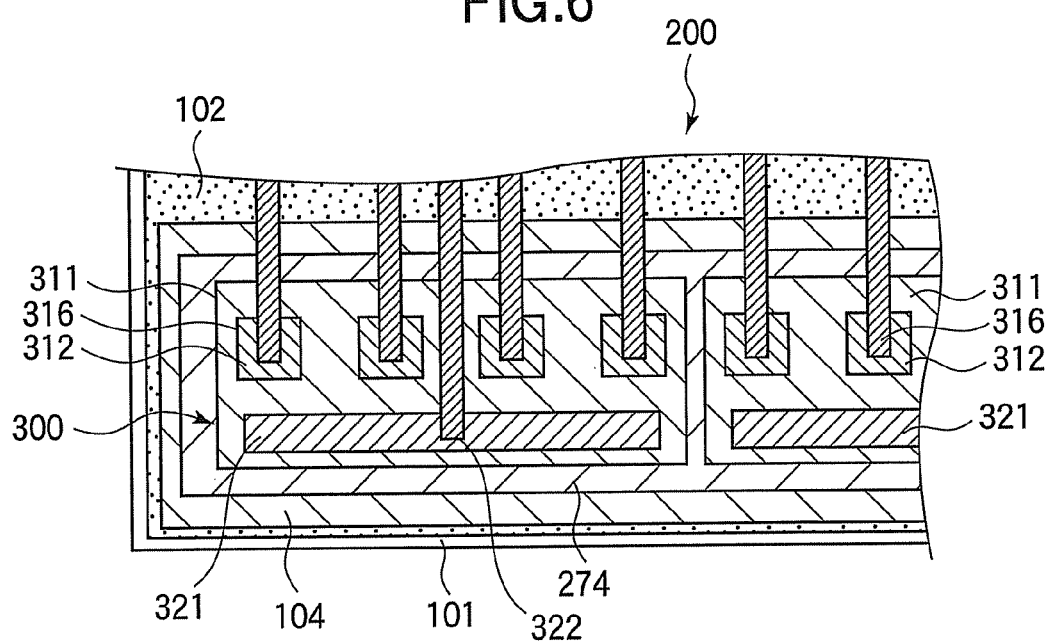
FIG. 6 illustrates an example of the semiconductor thin film layer having a plurality of semiconductor layers.
Figure 7:
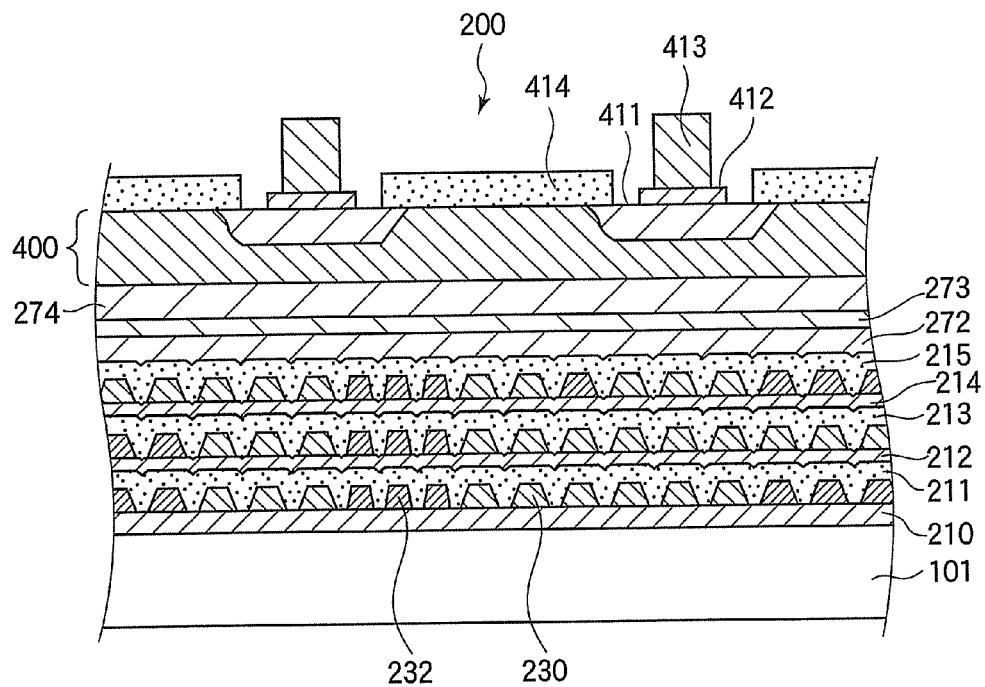
FIG. 7 illustrates another configuration of the semiconductor thin film layer.
Figure 8:
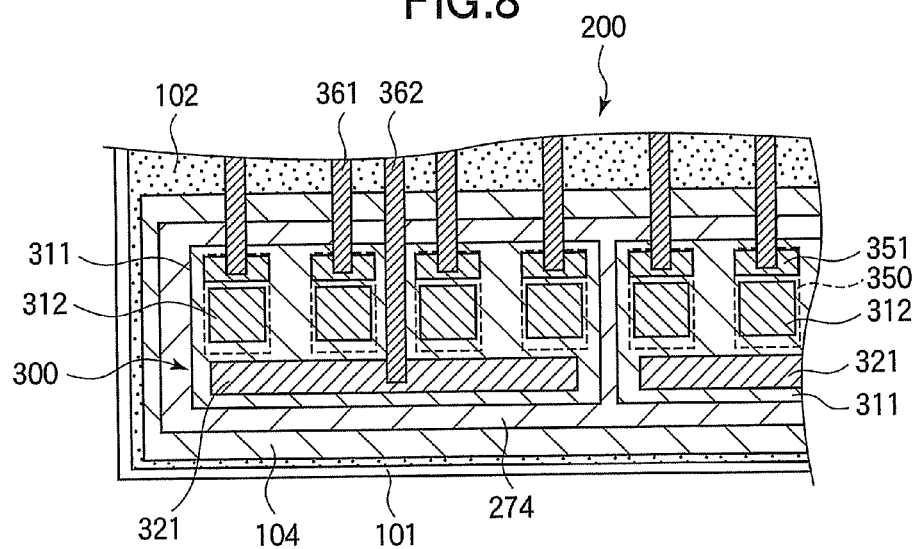
FIG. 8 illustrates still another configuration of the semiconductor thin film layer in which a plurality of semiconductor layers is formed.

FIGS. 6-8 illustrate the other examples of the structure of the semiconductor thin film layer 300 having a light emitting array.

FIG. 6 illustrates an example of the semiconductor thin film layer 300. In this structure of the semiconductor thin film layer, the semiconductor layer is divided into plural regions, which permits the light emitting arrays to be driven in different ways. Elements in FIG. 6 equivalent to those in FIGS. 1 and 4 are given the same reference numerals.

FIG. 7 illustrates another configuration, i.e., a semiconductor thin film layer 400. Elements in FIG. 7 equal to those in FIGS. 1 and 4 are given the same reference numerals. The semiconductor devices described above are formed by electrically isolating the semiconductor thin film layer into individual light emitting elements. The light emitting elements may be formed by selective diffusion as shown in FIG. 7. Selective impurity diffusion regions 411 and 412 are formed by selectively doping impurity into the first conductive type semiconductor thin film layer 400.

FIG. 8 illustrates another structure of the semiconductor thin film layer 300 in which a plurality of semiconductor layers 311 are formed and transparent electrodes 350 are formed on the light emitting regions. Elements in FIG. 8 equivalent to those in FIGS. 1 and 4 are given the same reference numerals. A metal contact 351 for wiring is formed on the transparent electrode 350. Reference numerals 361 and 362 denote second conductive type side electrode and first conductive type side electrode, respectively.

Figure 9:
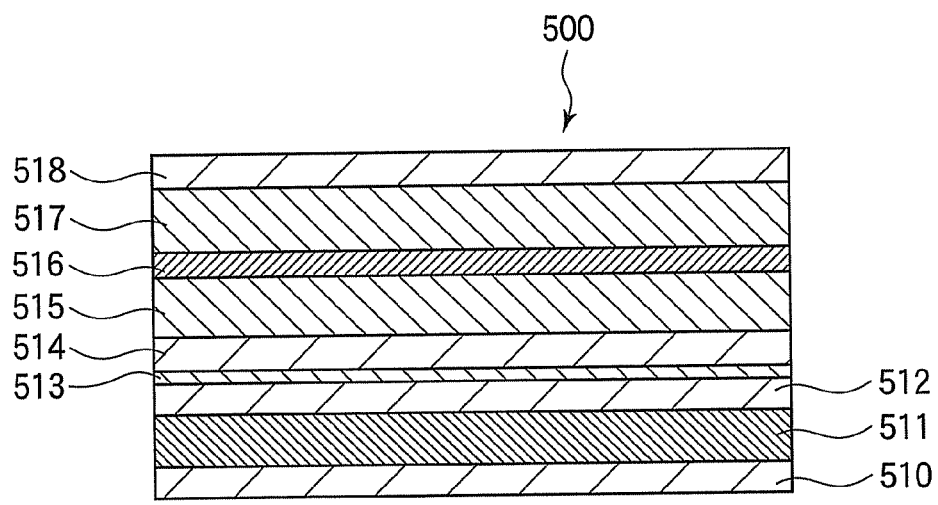
FIG. 9 illustrates a configuration of a semiconductor thin film layer for forming light emitting elements.
Figure 10:
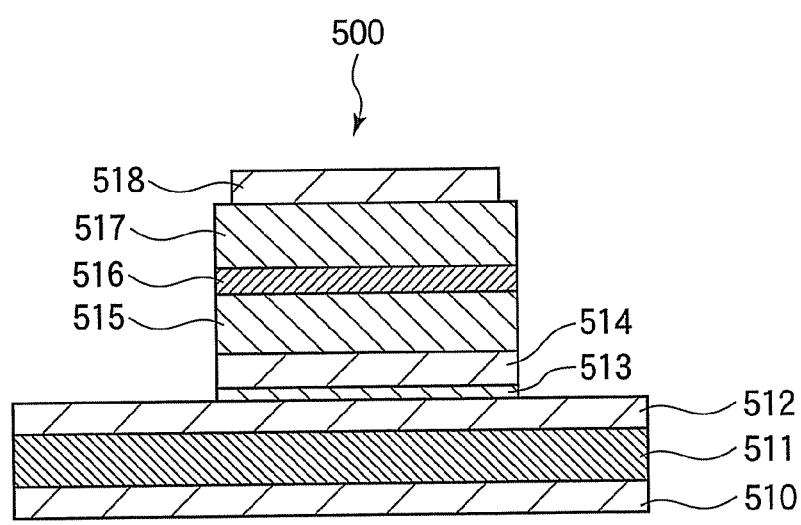
FIG. 10 illustrates the semiconductor thin film layer in FIG. 9 in which etching is performed to define isolated light emitting regions.

FIGS. 9 and 10 illustrate structures in which individual light emitting elements are formed in a semiconductor thin film layer by mesa etching for electrical isolation of light emitting elements.

FIG. 9 illustrates a configuration of a semiconductor thin film layer 500 in which light emitting elements are isolated from one another by shallow trench isolation. Referring to FIG. 9, a bonding layer 510 is a layer (e.g., GaAs) of first conductive type. An electrically conductive layer 511 is a layer (e.g., $Al_rGa_{1-r}As$) of first conductive type. A contact layer 512 is a layer of (GaAs) first conductive type. An etch stopping layer 513 of first conductive type is, for example, $In_sGa_{1-s}P$ where s=0.48 to 0.49, of which lattice constant substantially equal to quartz lattice constant. An isolation layer 514 of first conductive type is a layer of, for example, GaAs. A cladding layer of first conductive type is a layer of, for example, $Al_xGa_{1-x}As$. An active layer 516 of first conductive is a layer of, for example, $Al_yGa_{1-y}As$. A cladding layer 517 of second conductive type is a layer of, for example, $Al_zGa_{1-z}As$. A contact layer 518 is a contact layer of second conductive type. In the first embodiment, semiconductor elements in the semiconductor 500 that are isolated each other are LEDs as light emitting elements.

FIG. 10 illustrates the semiconductor thin film layer 500 in FIG. 9 in which the etching regions are formed by mesa etching to the surface of the constant layer of first conductive type (512) and the island shaped light emitting regions are electrically isolated each other by the etching regions. The semiconductor layer 311 of FIG. 4 corresponds to a group of layers from the bonding layer 510 of first conductive type to the contact layer 512 of first conductive type. The semiconductor layer 312 of FIG. 4 corresponds to a group of layers from the etch stopper 513 of first conductive type to the contact layer 518 of second conductive type.

Figure 11:
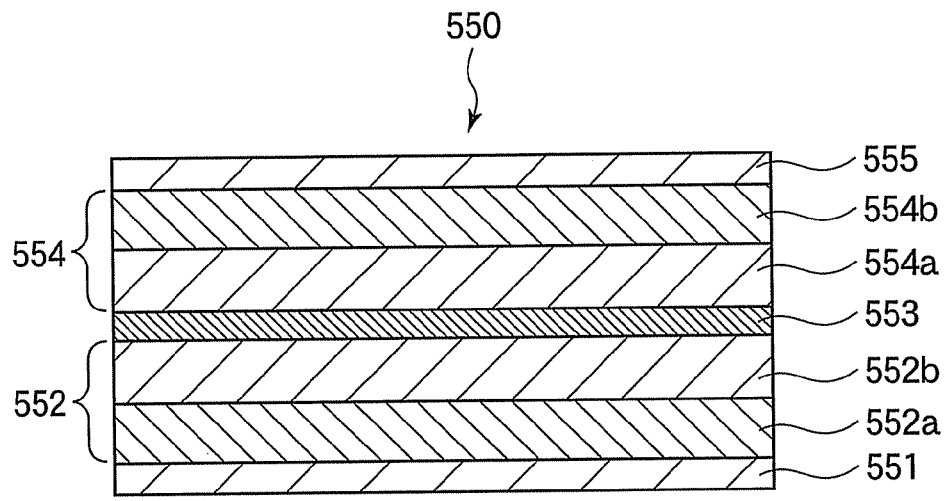
FIG. 11 illustrates a structure of an epi-layer of a semiconductor thin film layer.
Figure 12:
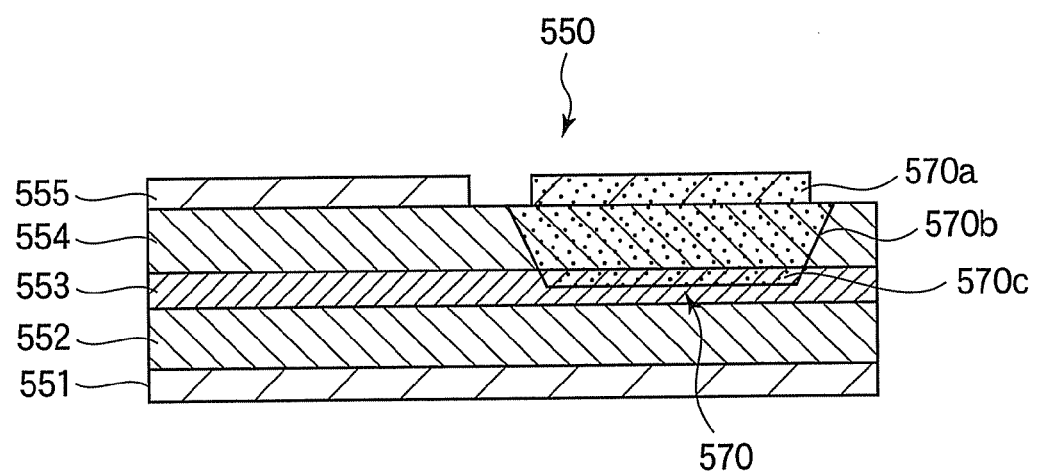
FIG. 12 is a cross-sectional view of the epi-structure of FIG. 11 which is selectively doped with an impurity of second conductivity type to form impurity diffusion regions of the second conductivity type.

FIGS. 11 and 12 illustrate the semiconductor thin film layer on which light emitting elements are formed by selective impurity diffusion.

FIG. 11 illustrates a structure of epitaxial layers of a semiconductor thin film layer. Referring to FIG. 11, a bonding layer 551 is a layer of GaAs of first conductive type. A lower cladding layer 552 is a stacked layer structure including a layer 552a of $Al_{x1}Ga_{1-x1}As$ and a layer 552b of $Al_{x2}Ga_{1-x2}As$. An active layer 553 of first conductive type is a layer of $Al_yGa_{1-y}As$. An upper cladding layer 554 is a stacked layer structure including a layer 554a of $Al_{z1}Ga_{1-z1}As$ and a layer 554b of $Al_{z2}Ga_{1-z2}As$. A contact layer 555 is a layer of, for example, GaAs.

FIG. 12 is a cross-sectional view of the epitaxial layer structure of FIG. 11 which is selectively doped with an impurity of second conductivity type to form impurity diffusion regions of second conductive type. An impurity diffusion region 570 is of second conductive type. Reference numerals 570a and 570b denote a contact layer of second conductive type and a cladding layer of second conductive type, respectively. An active layer 570c is a layer of second conductive type. The active layer 570c is an impurity diffusion region whose front portion lies in the active layer 553. Minority carriers are injected into the active region through a pn junction in the active layer 553, and confined within the active layer 553, thereby a light emitting region is in the active layer 553. The individual semiconductor elements (i.e., LEDs) emit light.

FIGS. 13-16 illustrate modification to the composite semiconductor device 100 (FIG. 1). Elements equivalent to those of FIG. 1 are given the same reference numerals.

FIG. 13 illustrates the smoothing region 104 disposed at the area closer to the center of the integrated circuit region 102.

Figure 14:
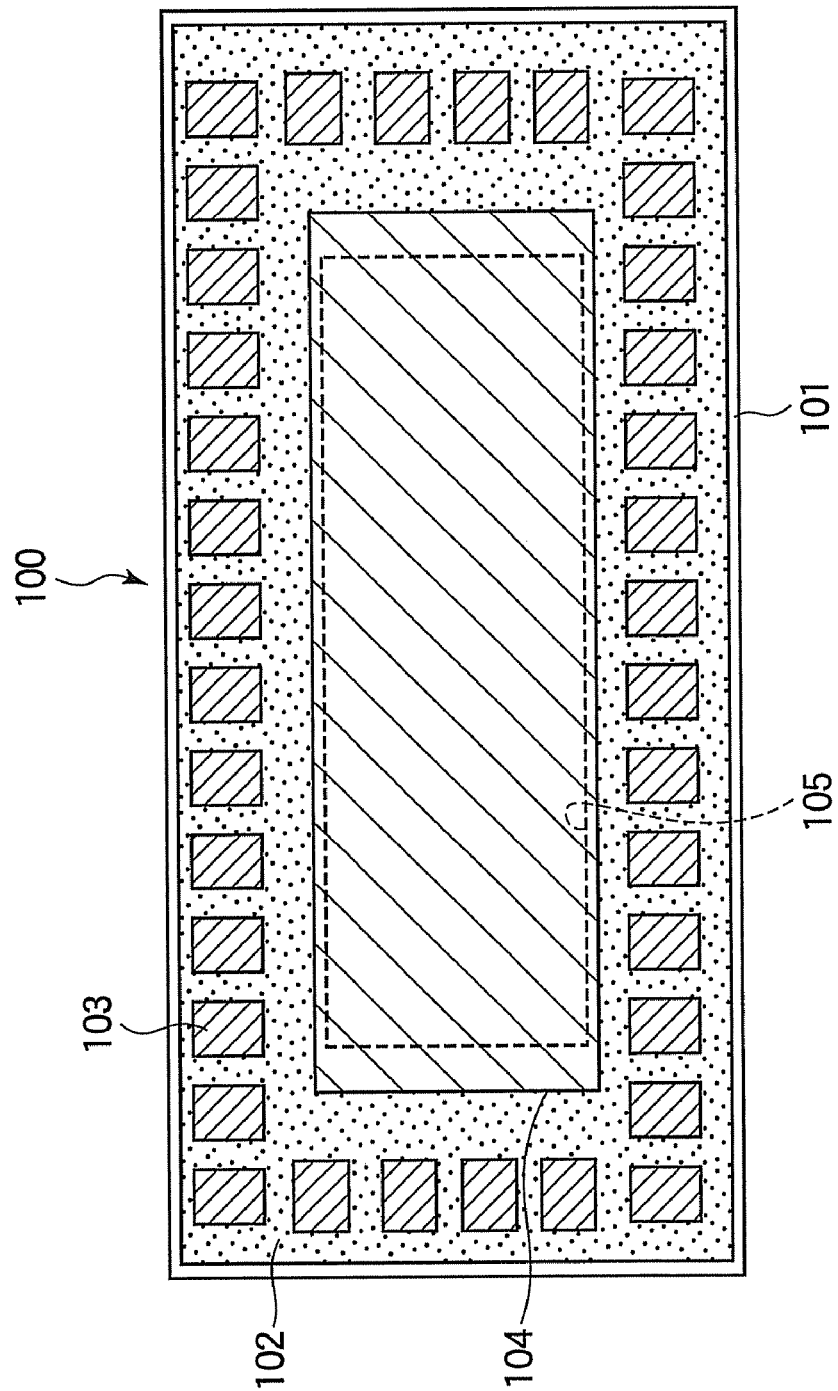
FIG. 14 illustrates the smoothing region disposed on the center area of the integrated circuit region.

FIG. 14 illustrates the smoothing region 104 disposed on the center area of the integrated circuit region 102 and the input/output connection pads 103 disposed at the peripheral region of the integrated circuit region 102.

FIG. 15 illustrates two smoothing regions disposed side by side on the integrated circuit region 102.

Figure 16:
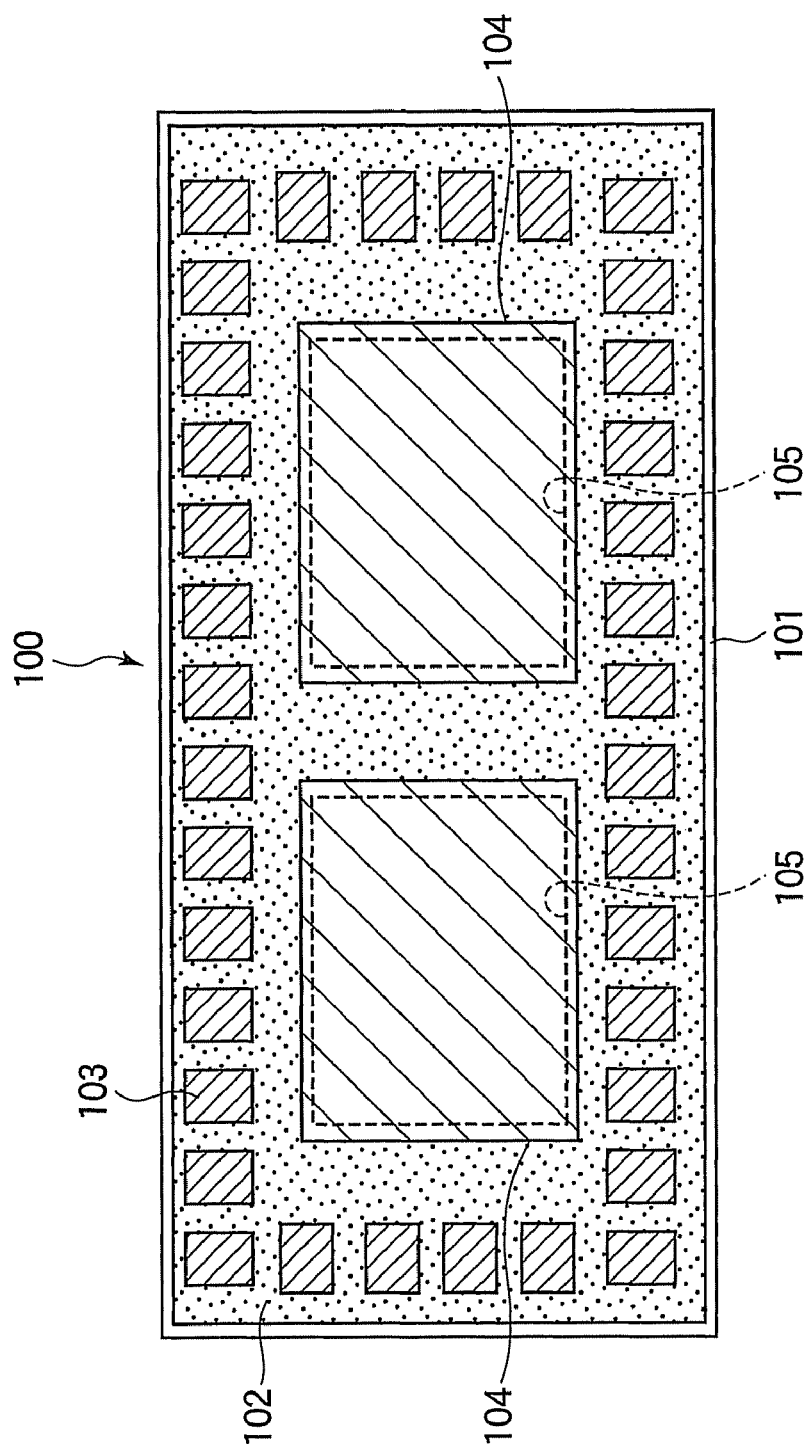
FIG. 16 illustrates two smoothing regions disposed and being apart each other on the integrated circuit region.

FIG. 16 illustrates two smoothing regions 104 disposed and being apart each other on the integrated circuit region 102.

A larger number of smoothing regions may be formed. A plurality of rows of input/output connector pads may also be formed As long as the smoothing surface of the semiconductor device is obtained, the dielectric layers that form the multilayer interconnection may be modified in number and material. The input/output connection pads need not be arranged at equal intervals but may be disposed with any intervals between them. The dummy patterns may also be altered in their arrangement. The substrate is not limited to an Si substrate. The semiconductor elements formed in the semiconductor thin film layer may be other elements than light emitting elements. Some portions of the semiconductor device may be smoothed by chemical and mechanical polishing (CMP). The dummy pattern and the CMP may be used in combination for smoothing the integrated circuit driver surface.

As described above, the composite semiconductor device of the first embodiment includes a structure of multiple wiring layers that form integrated circuits on a substrate. Dummy patterns that do not contribute to the operation of the circuit operation are formed. Patterns and film structure are employed to form a smooth surface on a wiring pattern multilayer. An oxide thin film or a layer of an organic material is formed to improve the flatness of the surface of the top layer of the wiring pattern multiplayer. A semiconductor thin film having semiconductor device elements is bonded on the smoothed surface. Thus, the semiconductor thin film may be bonded on the driver integrated circuits with sufficient bonding strength. The smoothing structure eliminates the need for forming bonding regions outside of the integrated circuit region 102. Therefore, the structure of the first embodiment reduces the size of a composite semiconductor device that incorporates the driver circuits and semiconductor thin film layers.

Second Embodiment

Figure 17:
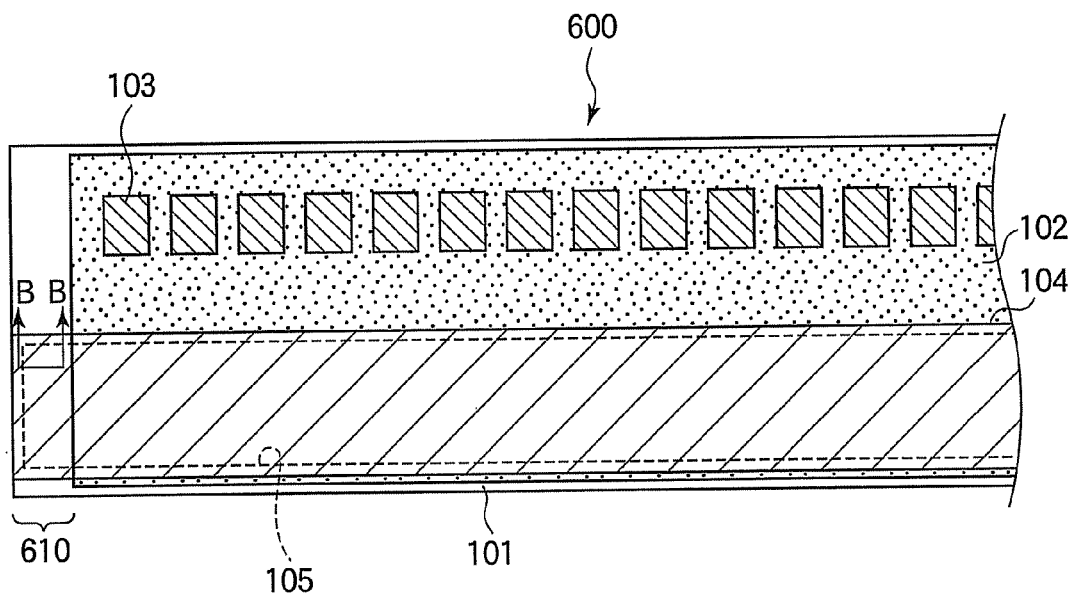
FIG. 17 is a top view illustrating a pertinent portion of a composite semiconductor device of a second embodiment.

FIG. 17 is a top view illustrating a pertinent portion of a composite semiconductor device 600 of a second embodiment.

The composite semiconductor device 600 differs from the composite semiconductor device 100 of the first embodiment in that the smoothing region 104 extends partially off the integrated circuit region 102 into an extended region 610. Elements equivalent to those of the composite semiconductor device 100 are given the same reference numerals and their description is omitted.

Figure 18:
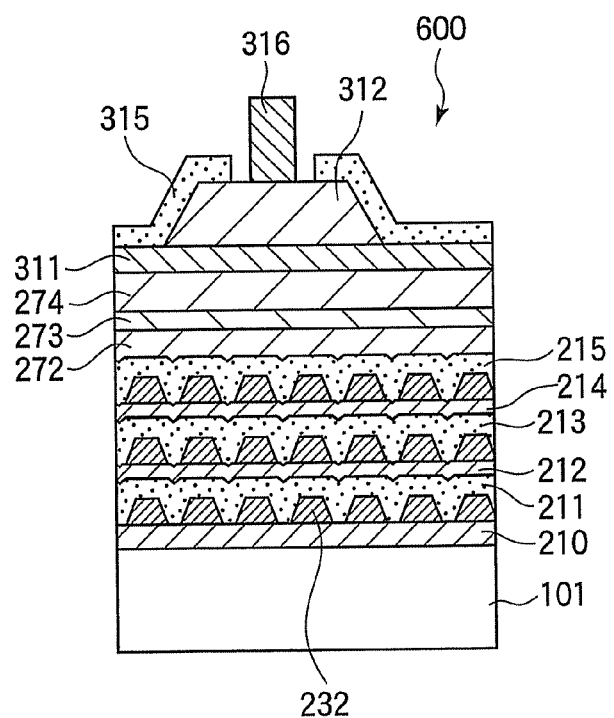
FIG. 18 is a cross-sectional view of the extended region 610 taken along a line B-B of FIG. 17.
Figure 23:
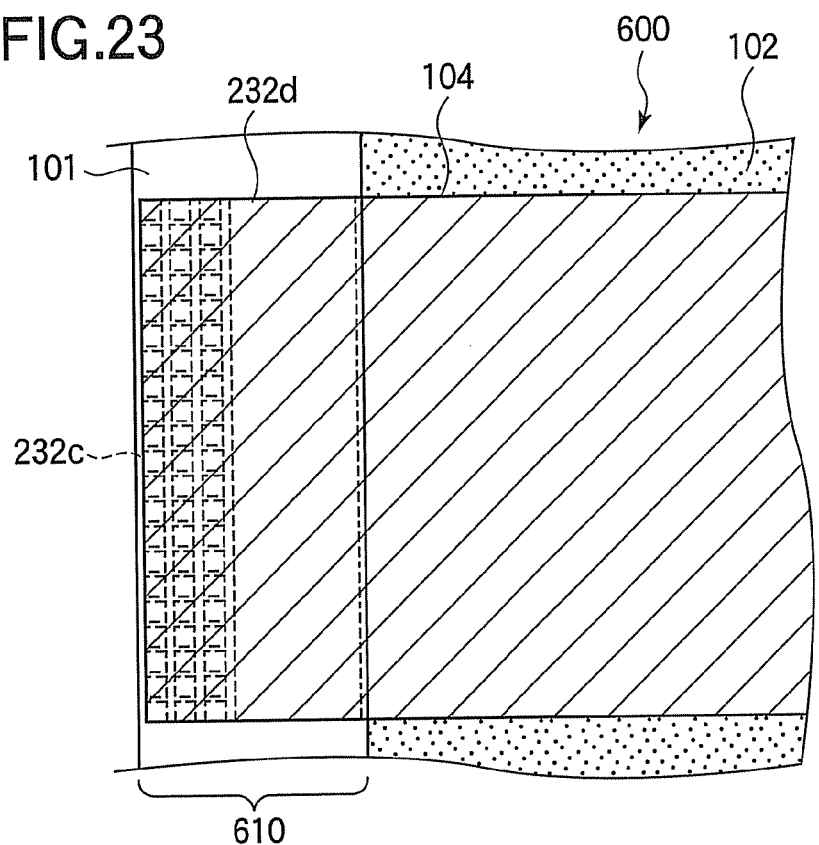
FIG. 23 illustrates still another modification to the dummy pattern formed in the extended region.
Figure 24:
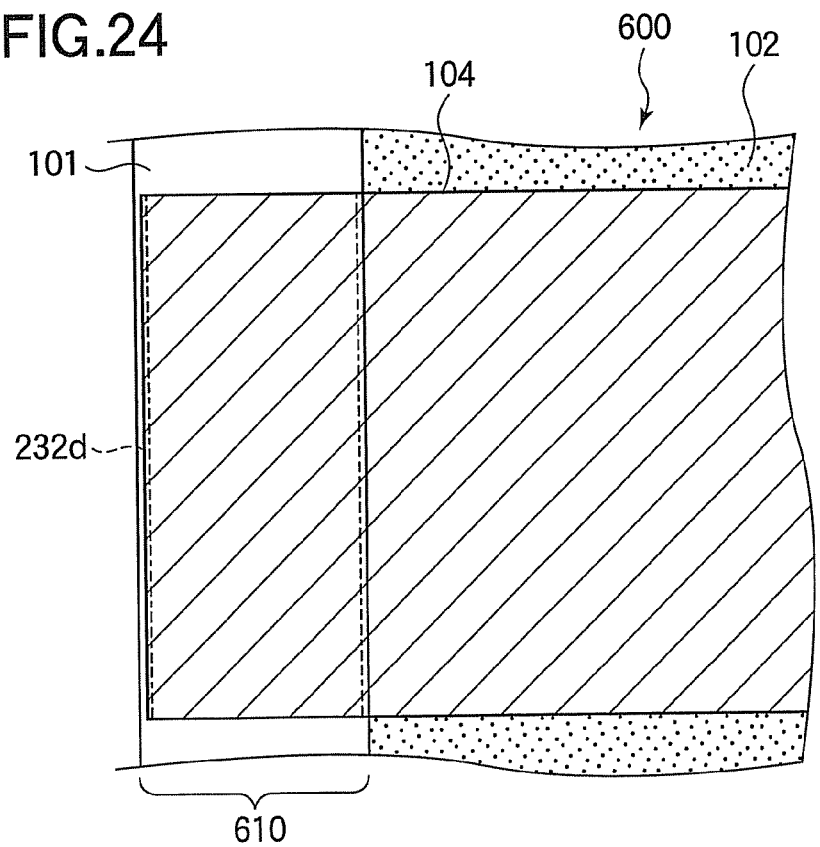
FIG. 24 illustrates yet another dummy pattern formed in the extended region.

No wiring pattern for connecting circuits is formed in the extended region 610. Instead, the extended region 610 includes a multilayer structure similar to that of the multilayer interconnection in the integrated circuit region, and dummy patterns are disposed in the respective layers. FIG. 18 is a cross-sectional view of the extended region 610 taken along a line B-B of FIG. 17. Referring to FIG. 18, a semiconductor thin film having the semiconductor elements is formed over the smoothing region 104 implemented by the dummy patterns, and that the semiconductor elements are also formed in the extended region 610. The wiring pattern (metallization) 230 is not formed in the extended region 610 and only dummy patterns 232 are formed.

FIG. 19 is a partial enlarged view of the dummy patterns 232. The dummy patterns 232 of, for example, the same size in the respective layers are formed at the same intervals such that the height and flatness of the dummy patterns 232 may be substantially the same as the wiring patterns 230 (FIG. 4) formed in the integrated circuit region 102. The spacing between adjacent dummy patterns and the spacing between dummy patterns and wiring patterns adjacent to the dummy patterns are preferably not greater than the thickness of the wiring pattern. For example, if the thickness of the wiring patterns 230 is 0.5 μm, the spacing between dummy patterns is selected to be less than or equal to 0.5 μm. Likewise, if the wiring pattern layer is 1 μm, the spacing between dummy patterns is selected to be less than or equal to 1 μm.

The shape of the dummy pattern 232 is not limited to that shown in FIG. 19. FIGS. 20-24 illustrate alternative shapes of the dummy pattern 232. For example, the dummy pattern 232 may be a belt-shaped pattern 232a as shown in FIG. 20, or a combination of small patterns 232b and the belt-shaped patterns 232a as shown in FIG. 21. Still alternatively, the dummy patterns 232 may be a combination of the small patterns 232b and small patterns 232c having different sizes from the small patterns 232b as shown in FIG. 22, or a combination of a wide belt-shaped pattern 232d and the small patterns 232c. Further alternatively, the shape of the dummy pattern 232 may be entirely belt-shaped.

The metal material for the dummy pattern 232 and insulating material are the same as those for the wiring pattern 230 in the integrated circuit region 102. The metal material is, for example, Al or a material containing Al, AlSiCu, or Cu. For the smoothing region 104, the material and process conditions should be selected such that a resulting structure has a degree of flatness (e.g., projections) lower than 30 nm.

Figure 25:
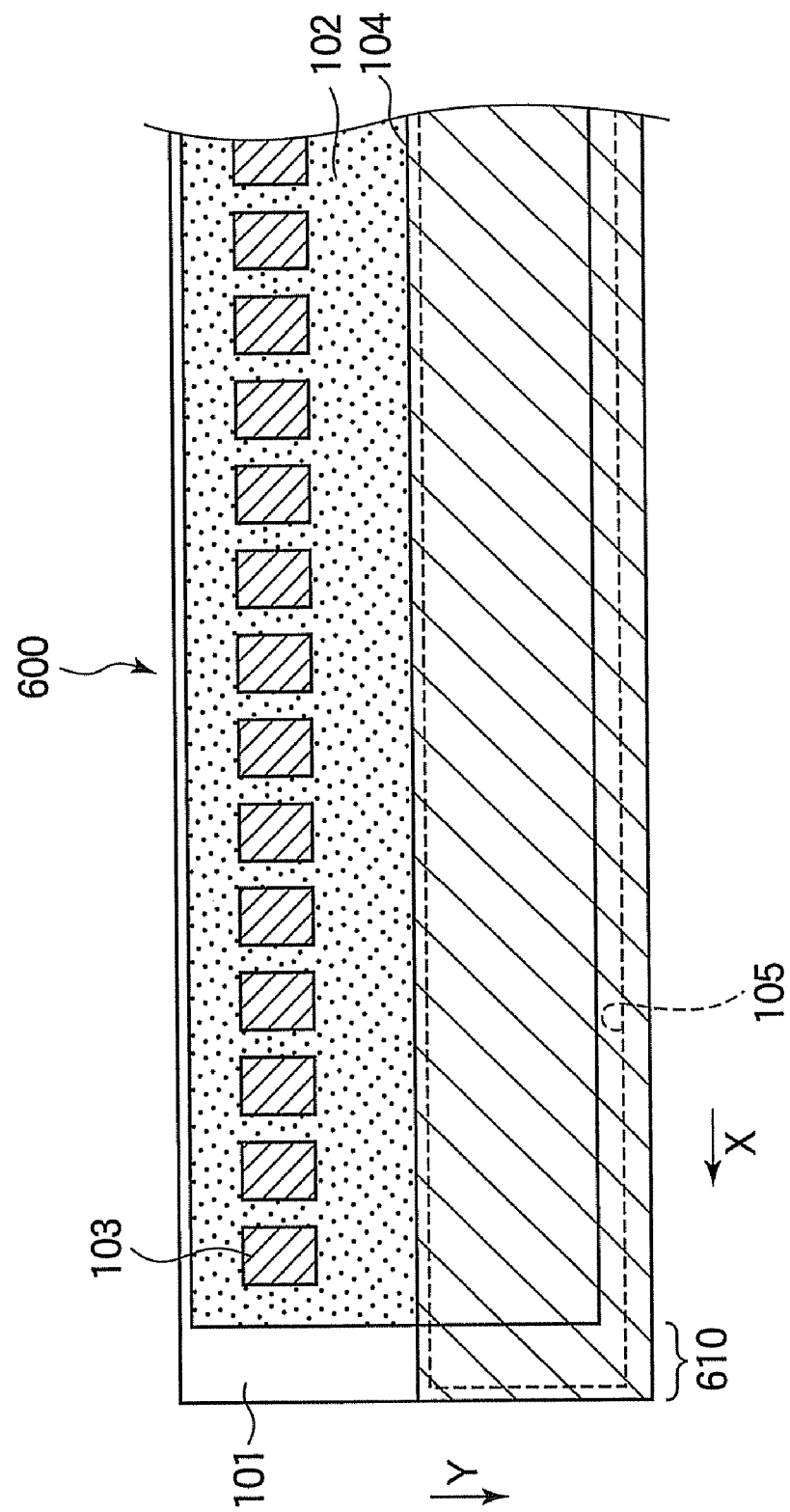
FIG. 25 illustrates another structure of the smoothing region and the integrated circuit region.
Figure 26:
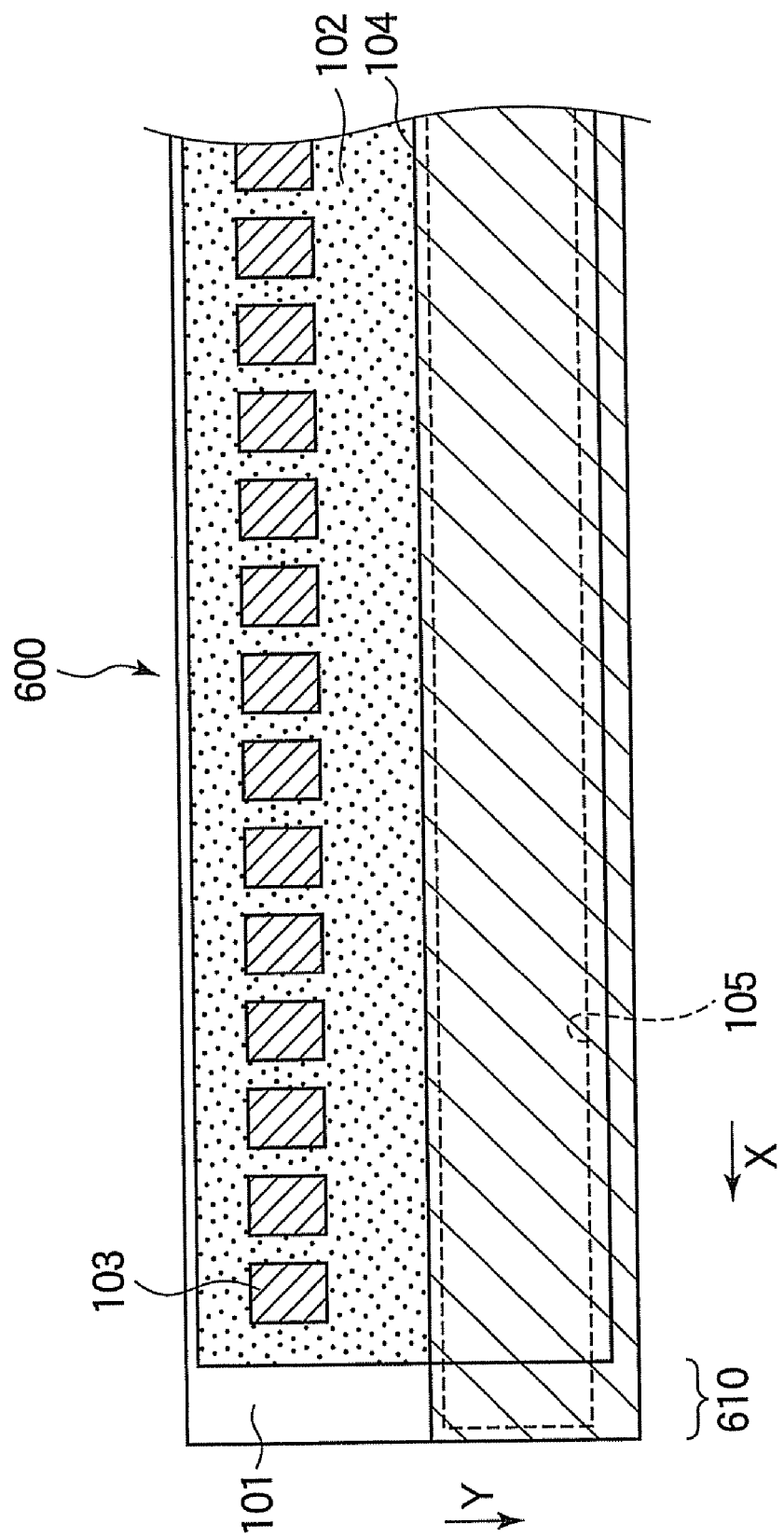
FIG. 26 illustrates still another configuration.

FIG. 25 illustrates another structure of the smoothing region 104 and the integrated circuit region 102. The smoothing region 104 extends partially off the integrated circuit region 102 in directions of the length and width of the integrated circuit region 102. The bonding region 105 also extends off the integrated circuit region 102 in directions of the length (X direction) and width of the integrated circuit region 102. FIG. 26 illustrates another structure in which the smoothing region 104 extends partially off the integrated circuit region 102 in directions of the length and width of the integrated circuit region 102 but the bonding region 105 only extends off the integrated circuit region 102 in the direction (X direction) of length of the integrated circuit region 102.

Figure 27:
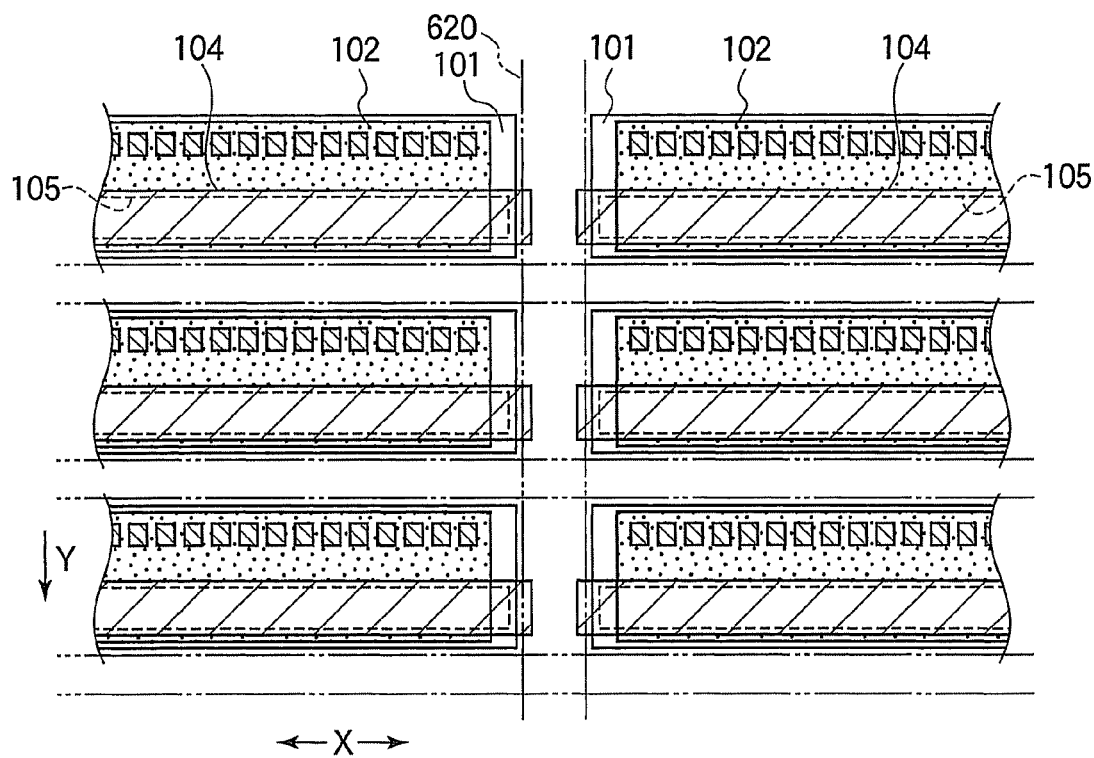
FIGS. 27 and 28 illustrate a composite semiconductor device before it is diced into individual chips.
Figure 28:
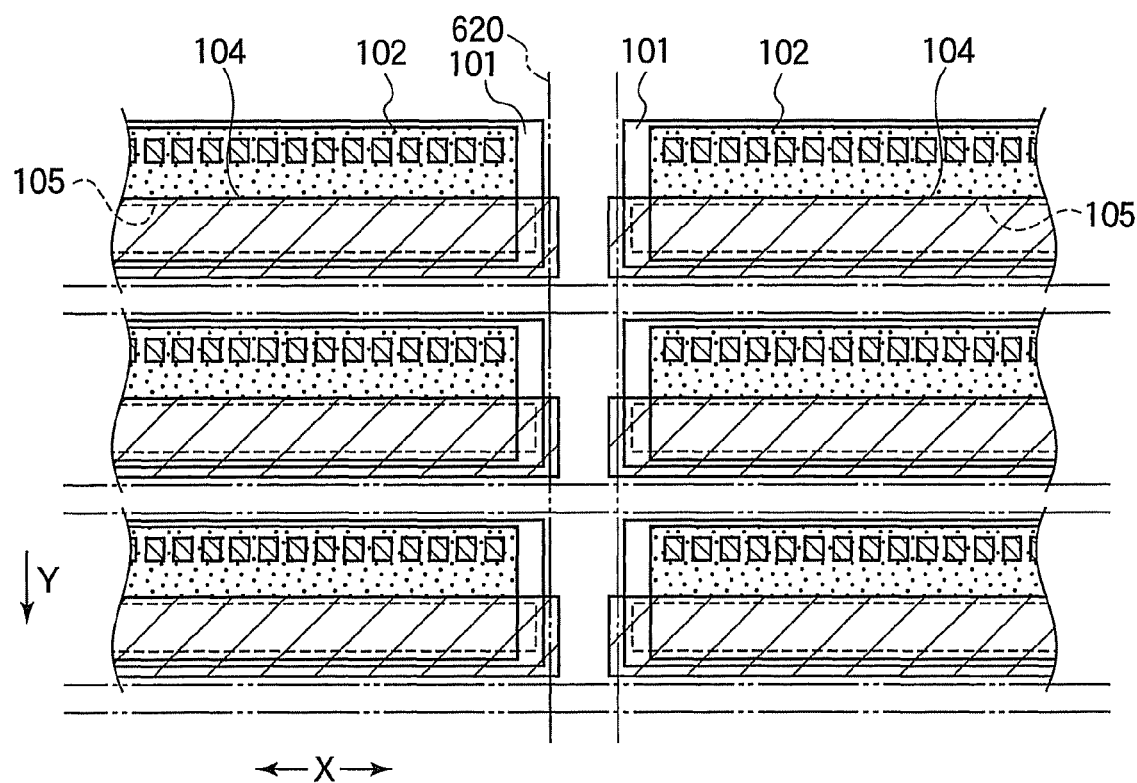

FIGS. 27 and 28 illustrate a composite semiconductor device before it is diced into individual chips. The composite semiconductor device is diced along dicing lines 620 (dot-dot-dash lines). The dicing in the direction of length (X-axis) is performed such that the bonding region 105 is not cut but the smoothing region 104 is partially cut. The dicing in the direction of width (Y-axis) is performed such that the smoothing region 104 is not cut. However, if individual chips are arranged with a sufficient dicing space among them, dicing should be performed not to cut the smoothing region 104 at all.

FIG. 27 illustrates a case in which the smoothing region 104 extends off the integrated circuit region 102 only in the direction (X-axis) of length of the integrated circuit region 102.

FIG. 28 illustrates a case in which the smoothing region 104 extends off the integrated circuit region both in the direction of length (X-axis) of the integrated circuit region 102 and in the direction of width (Y-axis).

As described above, because the smoothing region 104 extends partially off the integrated circuit region 102, the dicing lines are sufficiently away from the integrated circuit region 102. Thus, the structure described in the second embodiment minimizes damage to the integrated circuit region 102.

Third Embodiment

Figure 29:
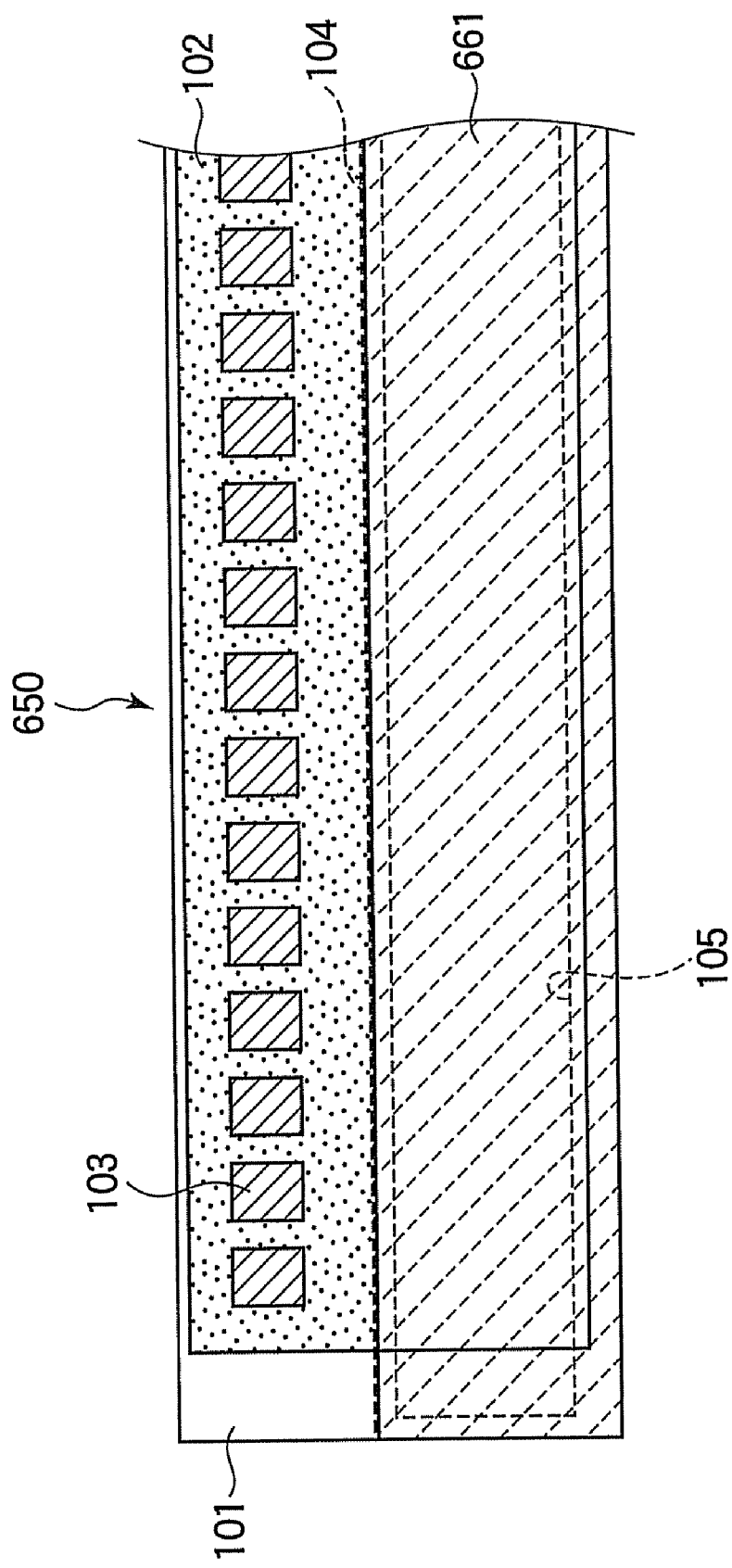
FIG. 29 is a top view illustrating a pertinent portion of a composite semiconductor device of a third embodiment.

FIG. 29 is a top view illustrating a pertinent portion of a composite semiconductor device 650 of a third embodiment.

The composite semiconductor device 650 differs from the composite semiconductor device 100 of the first embodiment in that a non-patterned metal layer is formed on top of a multilayer interconnection in the smoothing region 104. Elements equivalent to those of the composite semiconductor device 100 are been given the same reference numerals and their description is omitted.

Referring to FIG. 29, reference numerals 104 and 105 denote a smoothing region and a bonding region of a semiconductor thin film layer, respectively. A non-patterned metal layer 661 is formed as an uppermost layer of the wiring pattern multilayer. The smoothing region 104 is a region in which dummy patterns are provided in a layer lower than the uppermost layer (here, non-patterned metal 661) of the wiring pattern multilayer in order to decrease roughness of the upper most surface. The smoothing region 104 and the non-patterned metal layer 661 may be disposed relative to each other in a variety of configurations.

Figure 30:
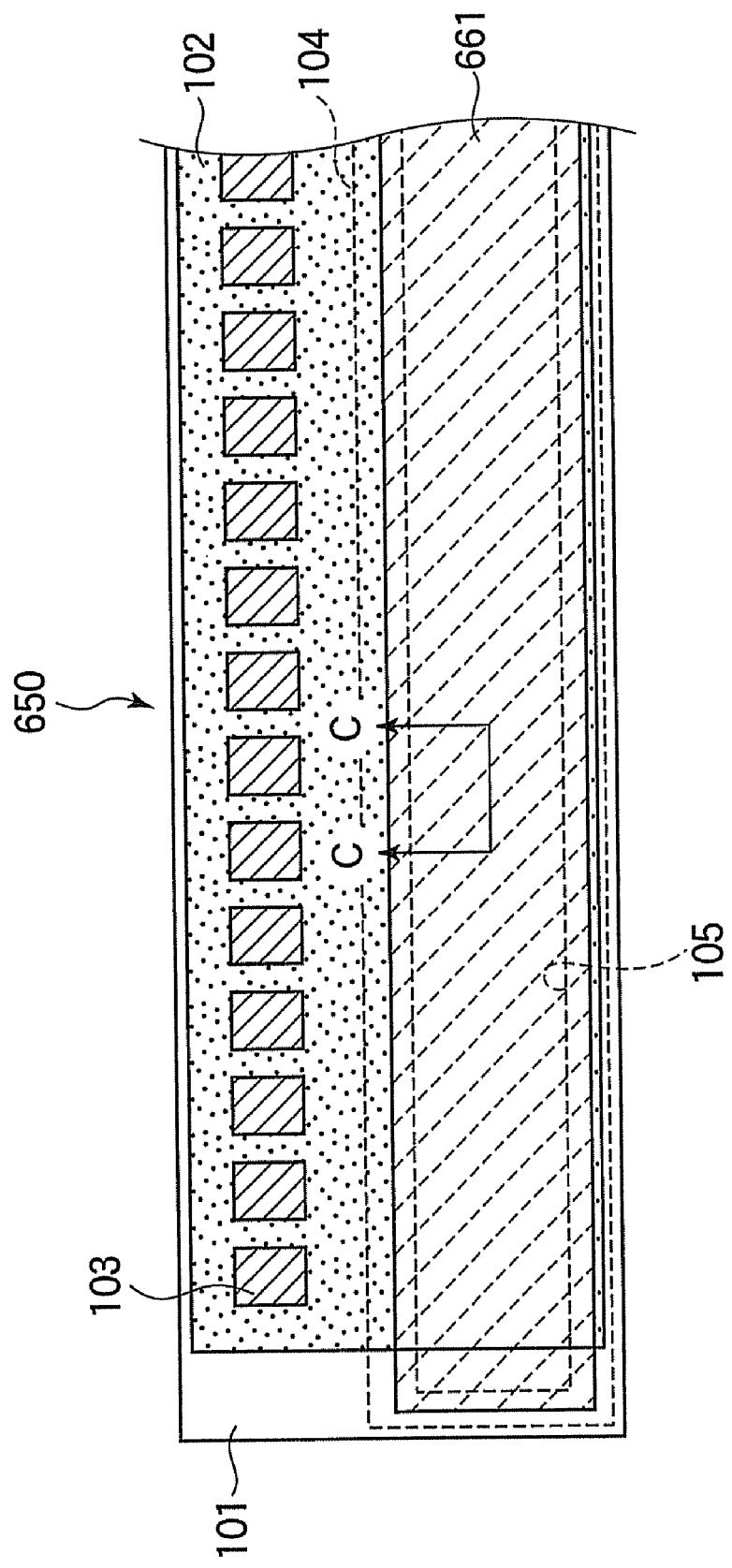
FIG. 30 illustrates a case in which the non-patterned metal layer occupies an area smaller than the smoothing region and larger than the bonding region.
Figure 31:
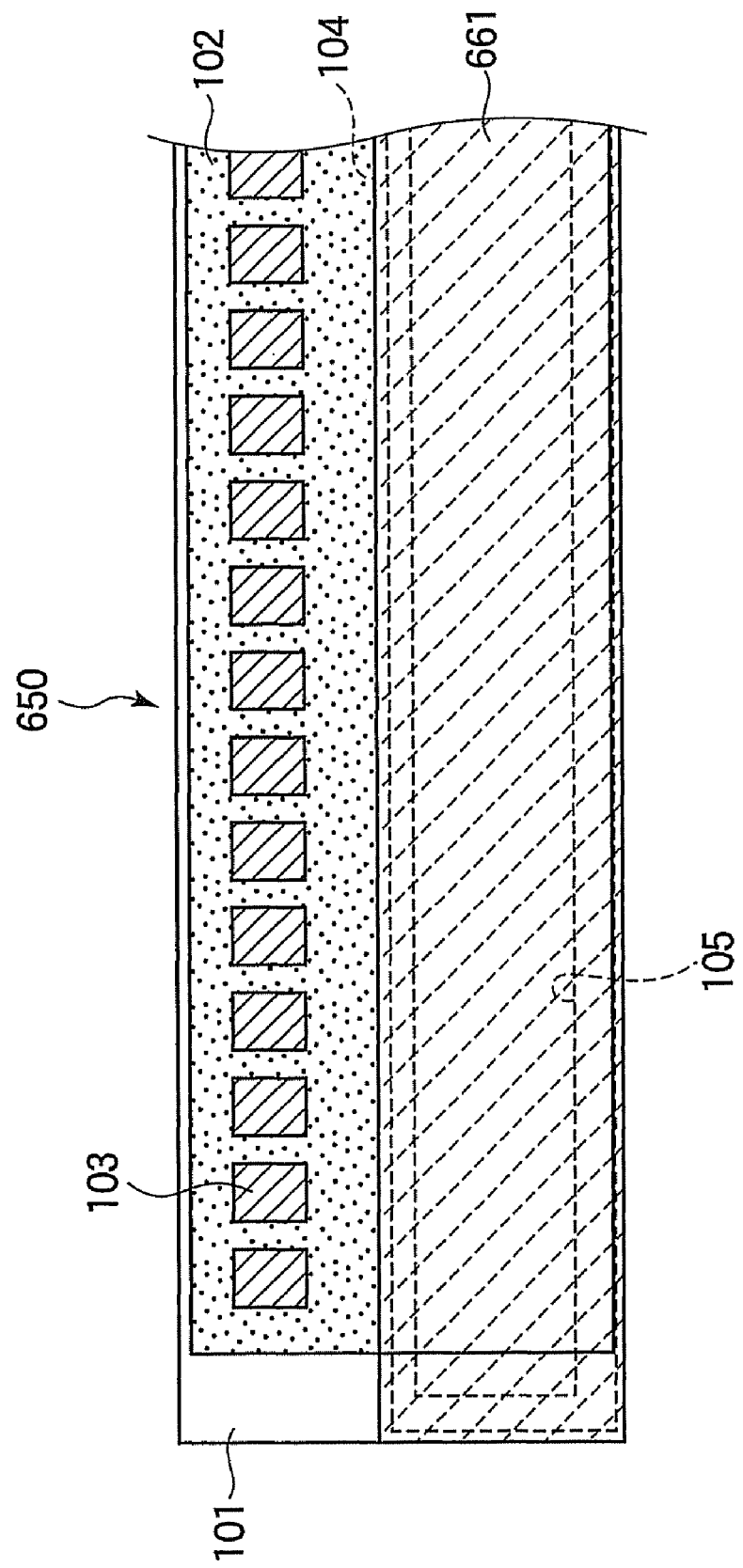
FIG. 31 illustrates a case in which the non-patterned metal layer occupies an area larger than the smoothing region.

FIG. 30 illustrates a case in which the non-patterned metal layer 661 occupies an area smaller than the smoothing region 104 and larger than the bonding region 105. FIG. 31 illustrates a case in which the non-patterned metal layer 661 occupies an area larger than the smoothing region 104. A variety of modifications may be made. The non-patterned metal layer 661 and an integrated circuit region 102 may be arranged relative to each other in a variety of configurations including the case described in the second embodiment. For example, the metal layer and the smoothing region may extend off the integrated circuit region 102.

Figure 32:
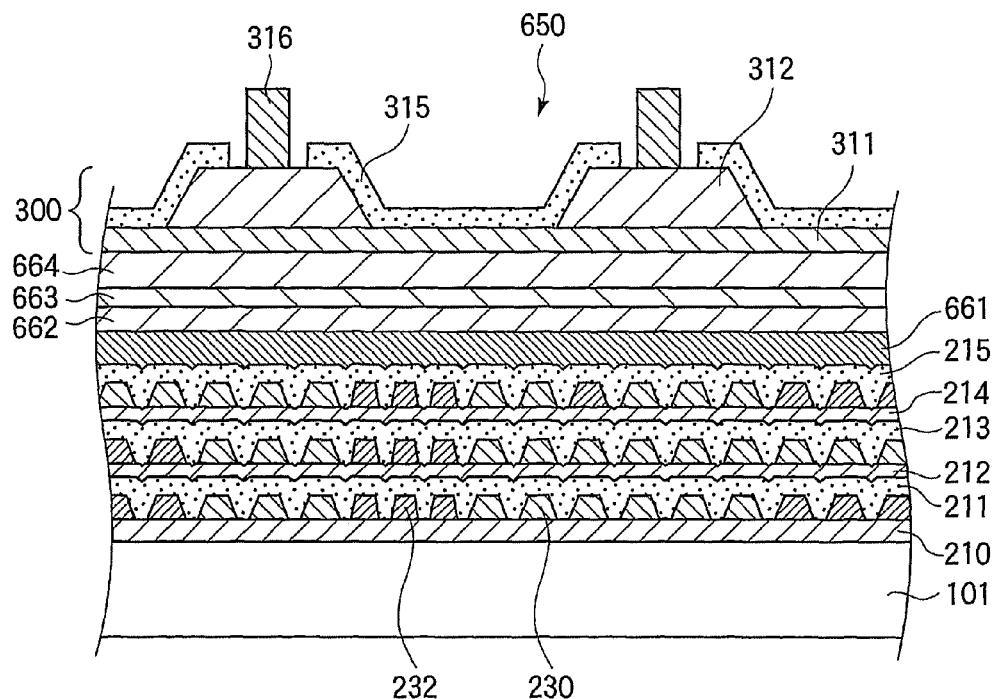
FIG. 32 is a cross-sectional view taken along a line C-C of FIG. 30, illustrating a semiconductor thin film formed on the smoothing region.

FIG. 32 is a cross-sectional view taken along a line C-C of FIG. 30, illustrating a semiconductor thin film formed on the smoothing region 104. Just as in FIG. 4, a semiconductor thin film having semiconductor elements is formed on a smoothing region (FIG. 30) implemented by dummy patterns. Dielectric film layers 210-215, a wiring pattern 230, and dummy patterns 230 are the same as those in FIG. 2. The dummy patterns 232 and interlayer dielectric films 211 and 212 cooperate to implement a smoothing surface.

A non-patterned metal layer 661 is formed as a top layer of the multilayer interconnection. An $SiO_2$ layer 662 (e.g., SOG film, CVD film, or sputtered film) is formed on the non-patterned metal layer 661. Reference numeral 663 denotes a nitride thin film (e.g., plasma CVD film). A coating film 664 is, for example, a layer of an organic material or an oxide. The semiconductor thin film layer 300 is bonded on the coating film 664. A portion of light emitted from a light emitting region in the semiconductor layer 312 emits away from the upper surface of the semiconductor device 650, and is reflected back by the non-patterned metal layer 661 toward the upper surface of the semiconductor device 650. Thus, the non-patterned metal layer 661 provides more efficient utilization of light emitted from the light emitting region.

As described above, the non-patterned metal layer formed on top of the smoothing region improves the flatness of the smoothing region, ensuring reliable bonding of the semiconductor thin film to the smoothing region. This increases the performance and reliability of the composite semiconductor device. For a composite semiconductor device having light emitting elements, the non-patterned metal layer provides a function of reflecting the light emitted from light emitting elements back to the surface of the composite semiconductor device.

Fourth Embodiment

Figure 33:
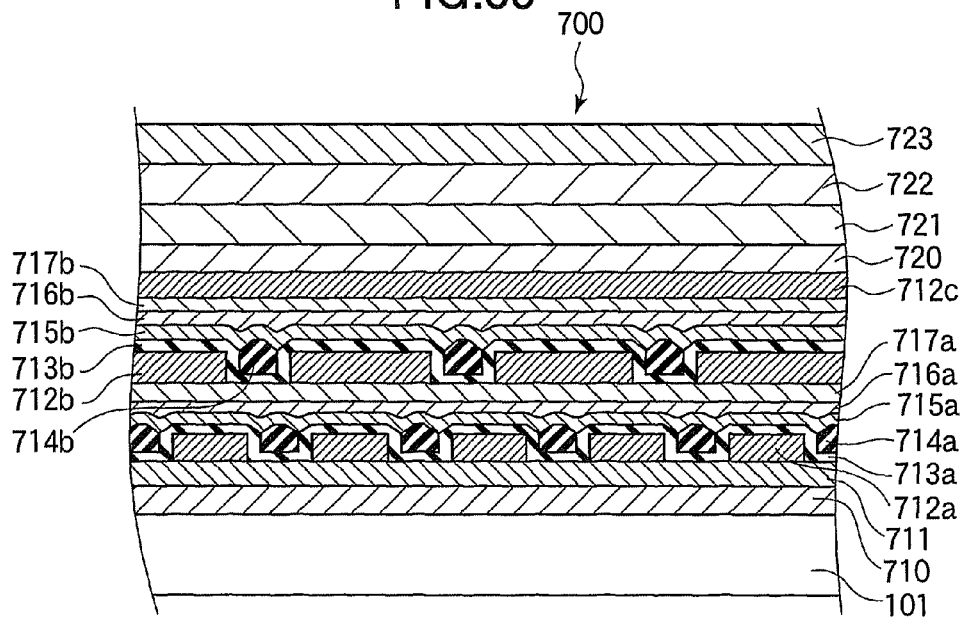
FIG. 33 is a cross-sectional view of a composite semiconductor device of a fourth embodiment, illustrating a pertinent portion.

FIG. 33 is a cross-sectional view of a composite semiconductor device 700 of a fourth embodiment, illustrating a pertinent portion. The composite semiconductor device 700 differs from the composite semiconductor device 100 of the first embodiment in the configuration of stacked layers of a smoothing region. Thus, reference is made to FIG. 1 for a top view of the composite semiconductor device 700. FIG. 33 corresponds to a cross-sectional view at the smoothing region for bonding semiconductor thin films; e.g., FIG. 33 is drawn as FIG. 2 is drawn by taking a cross-section along the line A-A of FIG. 1. Elements equivalent to those of the first embodiment are given the same reference numerals and their description is omitted in the fourth embodiment.

Referring to FIG. 33, reference numerals 101, 701, and 711 denote an Si substrate, a first interlayer dielectric film, and a second interlayer dielectric film, respectively. The first interlayer dielectric film 710 is an oxide film such as SiO2 while the second interlayer dielectric film 711 is an oxide film such as an $SiO_2$ CVD film or a sputtered film. Reference numerals 712a-717a denote layers in a first wiring layer. Reference numerals 712a, 713a, 714a, 715a, 716a, and 717a denote a metal pattern, a third dielectric film, a patterned dielectric material, a fourth interlayer dielectric film, a fifth interlayer dielectric film, and a sixth interlayer dielectric film, respectively. The metal pattern 712a of the first layer in the wiring layer (i.e., non-dummy wiring pattern, or non-dummy wiring pattern and dummy pattern) is formed of a material (stacked layers, mixed film, or alloy film) such as AlSiCu, AlSi, AlNi, AlTi, AlCr, or Cu. The surface of the metal layer may be covered with, for example, Ti or TiN. A third dielectric film 713a is, for example, an SiO₂ film (i.e., CVD film, sputtered film, or SOG film). The dielectric material pattern 714 (serves as a dummy pattern) is, for example, a spin-coated dielectric pattern such as an SOG layer pattern, or other inorganic material pattern.

The fourth and fifth interlayer dielectric films 715a and 716a are, for example, an SOG film. The sixth interlayer dielectric film 717a is, for example, an SiO₂ film (i.e., CVD film or sputtered film). Reference numerals 712b-717b denote layers in a second wiring layer, and are configured in the same manner as the layers 712a-717a in the first wiring layer.

Reference numeral 712c denotes a metal layer in a third wiring layer. A layer denoted at 720 is a layer of, for example, SiO₂ (i.e., CVD film, sputtered film, or SOG film). A layer denoted at 721 is a layer of, for example, SiN (i.e., CVD film). Reference numeral 722 may be, for example, a spin-coated film such as an oxide film or a film of an organic material. A semiconductor thin film 723 is bonded on the top of the layer 722. As described above, the each wiring layer below the top layer (layer 721 of SiN) of the multilayer interconnection (wiring pattern multilayer) has smoothing patterns and thin film structure to smooth rough surface of each wiring layer due to wiring patterns.

As described above, in addition to the metal patterns 712a and 712b (wiring pattern and/or dummy pattern), the dielectric pattern 714 is formed at the regions where the metal patterns are not formed, in order to avoid influence of spaces among the metal patterns on surface roughness.

The upper surface of the metal patterns 712a and 712b are covered with an insulating film having a first height with respect to a lower surface of the wiring layers. The first height is equal to the metal pattern thickness plus the thickness of the insulating film on the metal pattern. The insulating material pattern 714 is formed at the spaces among adjacent metal patterns, the insulating film 713 has a second height with respect to the lower surface of the wiring layers. The second height is equal to the thickness of the insulating thin film 713. The dielectric material pattern 714 has a height substantially equal to the difference between the first height and the second height.

A dielectric film pattern 714 provides more intimate contact with the spin-coated material than with a metal layer. Therefore, when the dummy patterns for smoothing roughness due to the metal patterns are formed in a relatively large area, the fourth embodiment provides a more reliable smoothing region.

Fifth Embodiment

Figure 34:
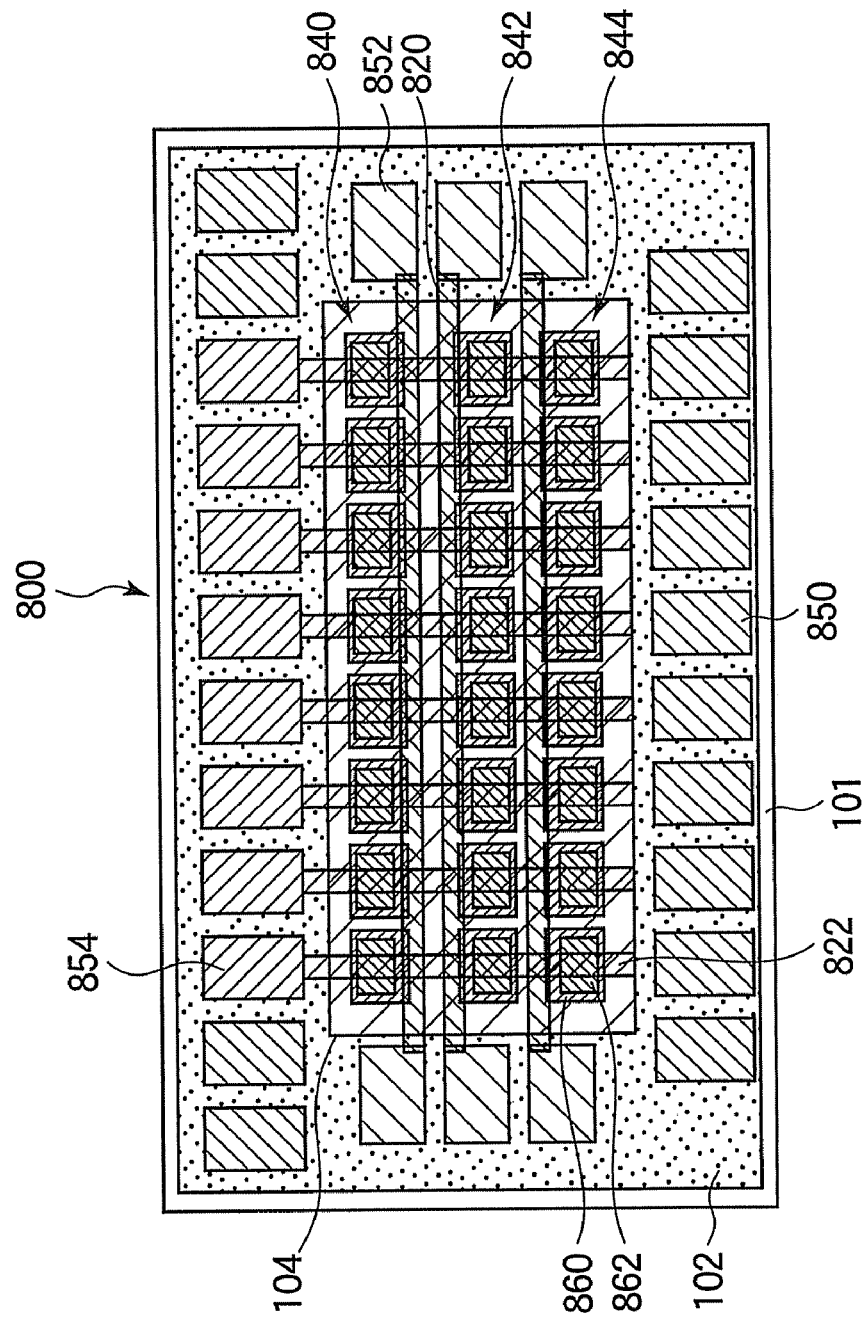
FIG. 34 is a top view illustrating a pertinent configuration of a composite semiconductor device of a fifth embodiment.

FIG. 34 is a top view of a composite semiconductor device 800 of a fifth embodiment illustrating a pertinent configuration.

The composite semiconductor device 800 differs from the composite semiconductor device 100 in that a plurality of thin film light emitting elements which emit light of a plurality of wavelengths are formed on the smoothing region 104 of the integrated circuit region 102, and in that the plurality of thin film light emitting elements are connected to the driver circuits by thin film wirings. Elements equivalent to those of the semiconductor device 200 (modification to the composite semiconductor device 100) are given the same reference numerals and their description is omitted in the fifth embodiment.

Referring to FIG. 34, the composite semiconductor device 800 includes an Si substrate 101, an integrated circuit region 102, and a smoothing region 104 formed on the integrated circuit region 102. The surface in the smoothing region is smoothed in the same manner as the first to fourth embodiments. First wirings 820 are wirings for first conductive type and second wirings 822 are wirings for second conductive type. Light emitting elements 840, and 842, and 844 are formed of different materials, and are aligned in a straight row. Reference numeral 860 denotes the first conductive type semiconductor region, and reference numeral 862 denotes the second conductive type semiconductor region. Connection pads 850 are used for receiving electric power and drive signals, and connection pads 852 and 854 are used for outputting signals to drive the light emitting elements. For example, the connection pads 852 are connected to the wirings 820 of first conductive types while the connection pads 854 are connected to the wirings 822 of second conductive type. The connection pads 850, 852, and 854 are connected to corresponding contact regions 252 of the wiring pattern 230 in the respective layers in FIG. 3 via the wiring formed on the top layer, for example.

The wirings 820 for the first conductive type and the wirings 822 for the second conductive type are electrically isolated using an interlayer dielectric (not shown), the wiring 820 being connected to a semiconductor region 860 of first conductive type of the respective light emitting elements while the wiring 822 being connected to a semiconductor region 862 of second conductive type of the respective light emitting elements.

Figure 35:
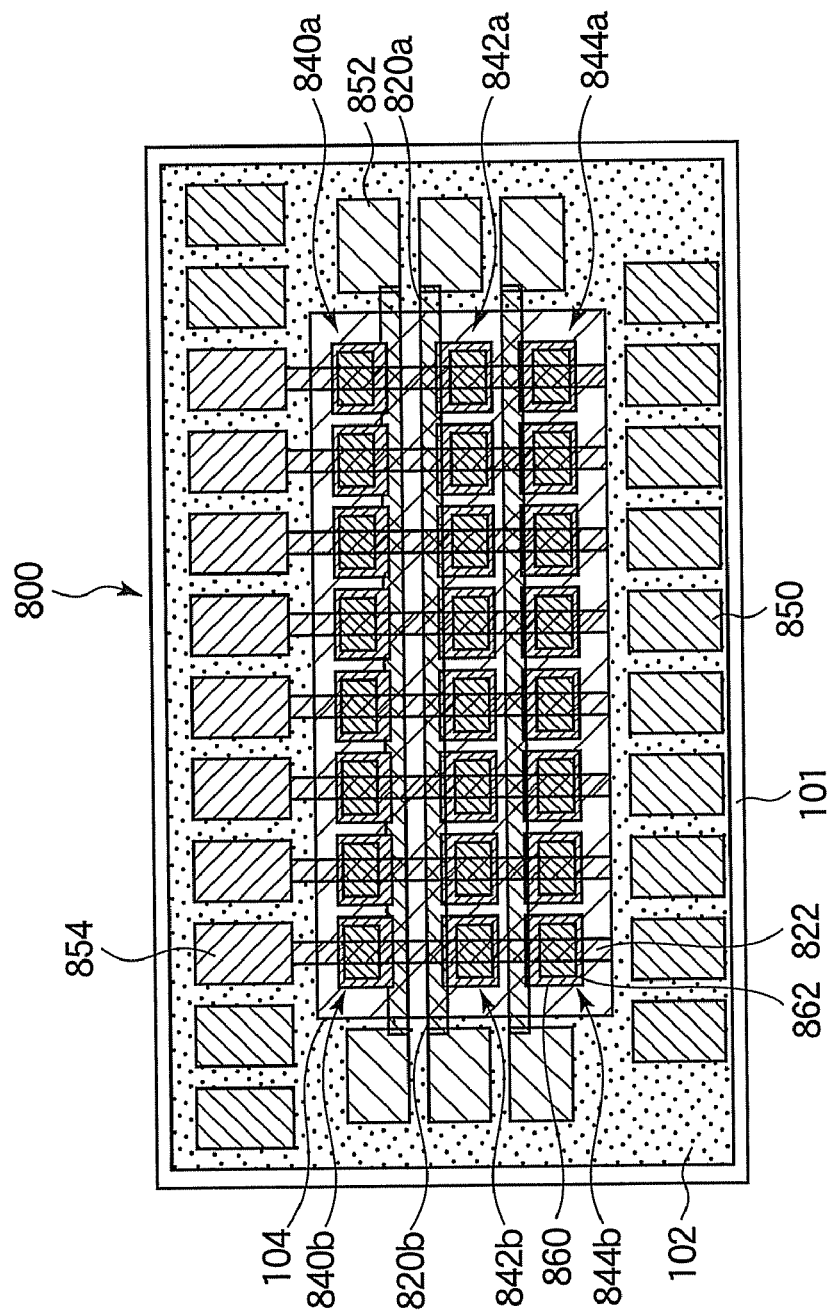
FIG. 35 is a top view of a modification to the composite semiconductor device.

FIG. 35 is a top view of a modification to the composite semiconductor device 800. Referring to FIG. 35, the wiring pattern 820 is divided into a left wiring 820a and a right wiring 820b. The light emitting elements 840, 842, and 844 are halved into a left groups of light emitting elements 840a, 842a, and 844a, and right groups of light emitting elements 840b, 842b, and 844b, respectively. By dividing the elements in this manner, a variety of modifications may be possible. For example, a plurality of groups may emit light of the same wavelength or each group may emit light of a different wavelength from the rest of the groups.

FIG. 35 illustrates 8 LEDs in each line. However, the number of LEDs in each line is not limited to eight. While LEDs are arranged in three lines, the number of lines is not limited to 3. The arrangement of the light emitting elements and wiring connection may be modified in a variety of ways. The connection pads may also be arranged in many configurations. For example, all the connection pads may be arranged in a single line or in a zigzag line such that each LED in one of two adjacent lines is between adjacent LEDs in the other of the two adjacent lines.

As described above, a plurality of elements are formed of different materials, and are arranged on integrated circuit regions. Therefore, the size of a composite semiconductor device may be reduced greatly. The modification also provides greater degrees of freedom in array structures of the light emitting elements, and semiconductor devices may be modified, which leads to better control of a color tone and light intensity.

Sixth Embodiment

Figure 36:
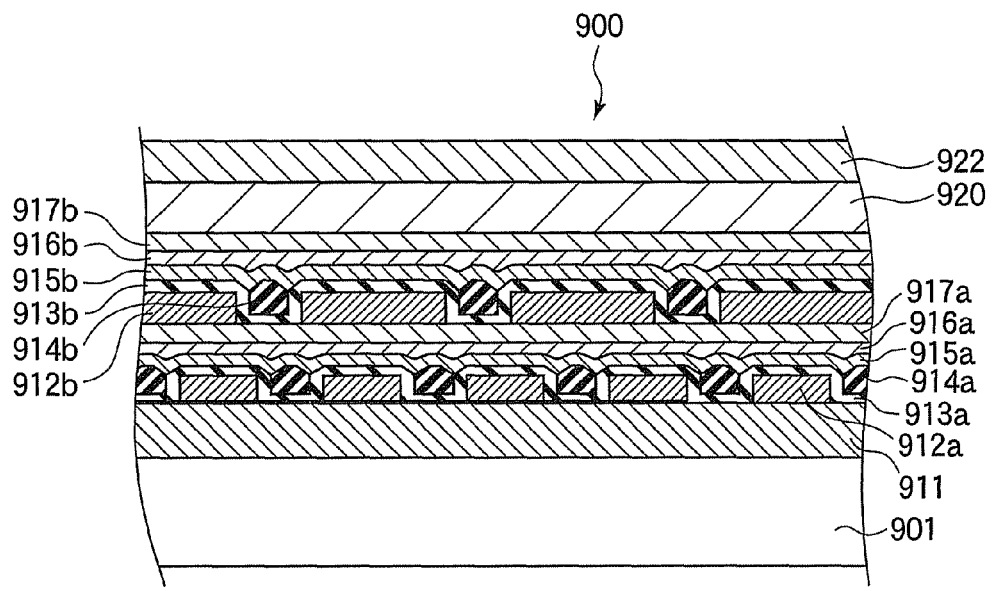
FIG. 36 illustrates a pertinent portion of a cross section of a composite semiconductor device of a sixth embodiment.

FIG. 36 illustrates a pertinent portion of a cross section of a composite semiconductor device of a sixth embodiment. A composite semiconductor 900 differs from the composite semiconductor of the first embodiment in a stacked structure of a smoothing region. FIG. 36 corresponds to a cross-sectional view similar to FIG. 2 of which cross section is taken along a line A-A of FIG. 1. Thus, elements equivalent to those of the composite semiconductor device 100 are given the same reference numerals and their description is omitted in the sixth embodiment.

Reference numerals 901 and 911 denote a glass substrate and an element layer formed of a polysilicon Si, respectively. A first wiring layer includes layers 912a-917a. Reference numeral 912a denotes a metal pattern (i.e., wiring pattern and/or dummy pattern). Reference numerals 913a and 914a denote an insulating film and a dummy pattern, respectively. A coating layer 915a is a spin-coated layer that improves planarization. An interlayer dielectric layer 916a is, for example, a layer of $SiO_2$ (e.g., sputtered film or SOG film). Reference numeral 917a denotes a layer of SiN (e.g., CVD film).

A second wiring layer includes layers 912b-917b formed in the same manner as the first wiring layer. Reference numeral 920 denotes, for example, a spin-coated layer of an organic material or an oxide material. A layer 922 is a semiconductor thin film that is bonded onto the layer 920 formed of an organic material.

Figure 37:
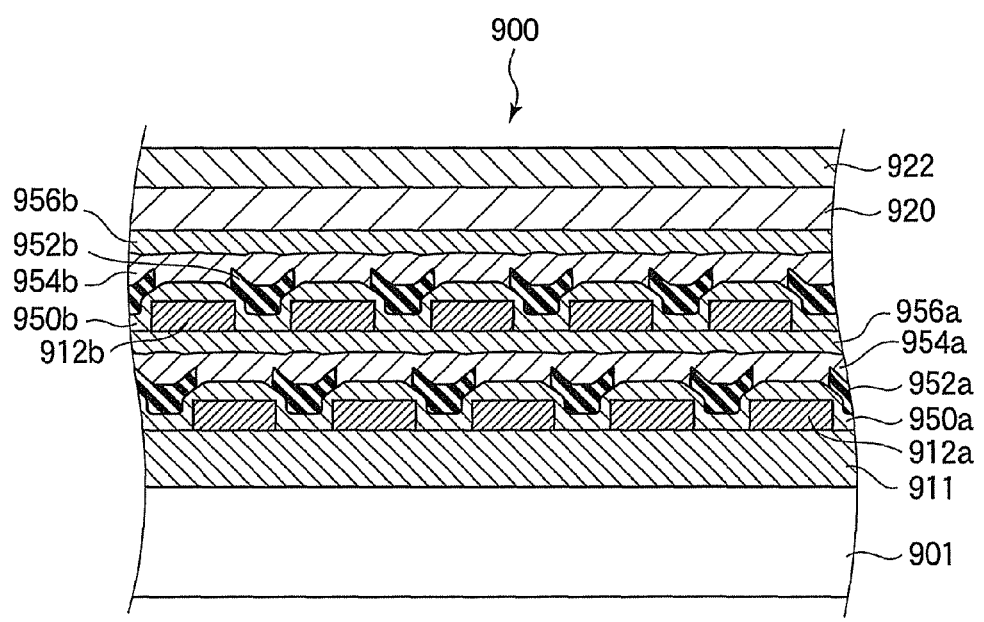
FIG. 37 illustrates a modification to the composite semiconductor device.

FIG. 37 illustrates a modification to the composite semiconductor device 900. Elements equivalent to those in FIG. 36 have been given the same reference numerals.

Dummy patterns for smoothing the wiring pattern region may be formed as shown in FIG. 37. Coating layers (e.g., spin-coated layer) 950a and 950b are formed to reduce roughness of the coating surface, and then dummy patterns 952a and 952b are formed on the spin-coated layers 950a and 950b for further reducing roughness of the coating surface further more. Such a structure of spin-coated layer/dummy pattern/ spin-coated films may also be employed in the first to fifth embodiments. Reference numerals 956a and 956b are insulating layers.

A composite semiconductor device may also be formed as follows: A semiconductor structure may be first formed on a glass substrate, including a layer of integrated circuit using polysilicon Si 911 and multilayer wirings (e.g., layers lower than the coating layers 920) formed on the layer of polysilicon Si. A semiconductor thin film may be bonded onto the semiconductor structure. Then, the semiconductor structure is released from the glass substrate, and is then mounted on a plastic substrate, a ceramic substrate, or a metal substrate. Alternatively, the polysilicon Si may be replaced with a circuit implemented with either a thin film or a thick film that is formed of amorphous Si or an organic material.

In the sixth embodiment, a thin film semiconductor is mounted on a circuit implemented in the form of a thin film or a thick film. This allows a reduction of an area necessary for a composite semiconductor device, just as in the first to fifth embodiments. The semiconductor device fabricated by mounting a thin film semiconductor on a circuit implemented in the form of a thin film or a thick film can be easily transferred from, for example, a glass substrate to another substrate.

Seventh Embodiment

Figure 38:
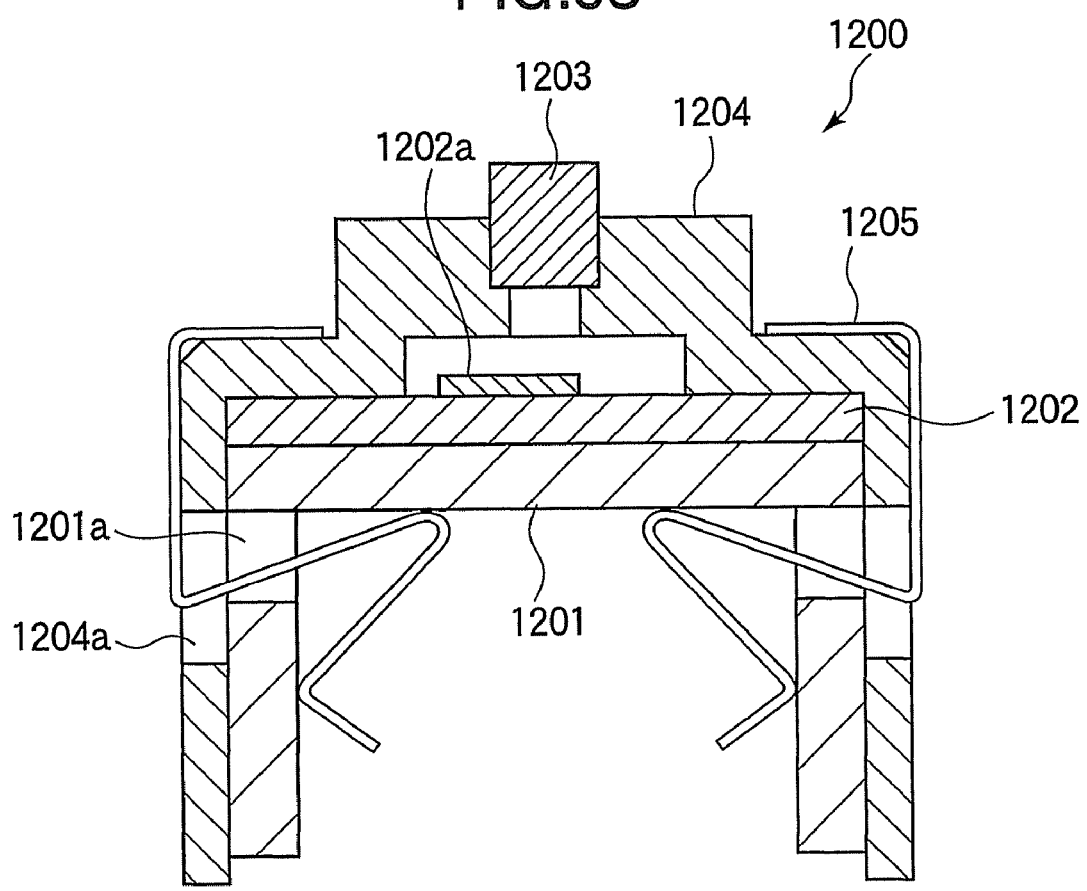
FIG. 38 illustrates an LED print head that employs the composite semiconductor device according to the invention.

FIG. 38 illustrates an LED print head 1200 that employs the composite semiconductor device according to the invention.

Figure 39:
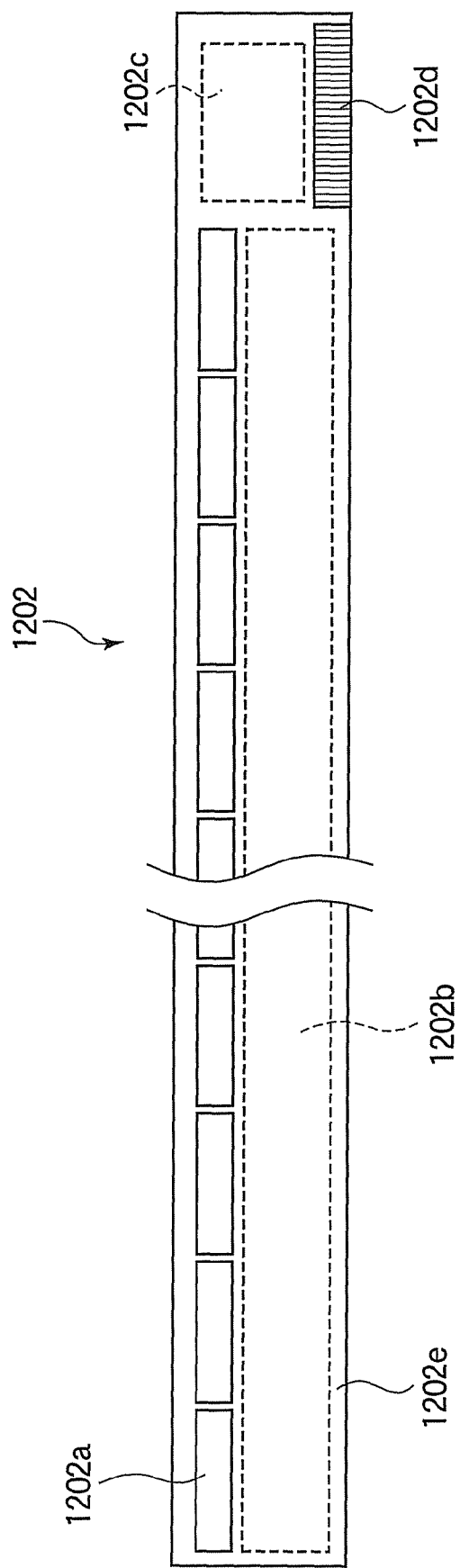
FIG. 39 is a top view illustrating a configuration of the LED unit.

An LED unit 1202 is mounted on a base material 1201. Composite semiconductor devices that are described in the first to sixth embodiments are mounted on the base material 1201. FIG. 39 is a top view illustrating a structure of the LED unit 1202. A plurality of composite semiconductor devices described in the first to sixth embodiments are mounted on the printed circuit board 1202e. The composite semiconductor device consists of the semiconductor thin film including light emitting regions and the integrated circuit drivers. A plurality of the composite semiconductor devices as a light emitting unit 1202a are mounted in a longitudinal direction of the printed circuit board. The printed circuit board 1202e also includes areas 1202b and 1202c in which electronic components and wiring are mounted. A connector 1202d is mounted on the printed circuit board and used for feeding control signals and electric power to the LED unit.

A rod lens array 1203 is disposed over the light emitting regions of the light emitting unit 1202a, focusing the light emitted from the light emitting elements. The rod lens array 1203 includes a plurality of column-shaped optical lenses aligned along light emitting elements, i.e., a line of the semiconductor layers 312 in FIG. 6. The rod lens array 1203 is held at a right position using a lens holder 1204.

The lens holder 1204 covers over the base material 1201 and LED unit 1202. The base material 1201, LED unit 1202, and lens holder 1204 are held together in integral form by using clampers 1205 that are mounted through openings 1201a and 1204a formed in the base 1201 and lens holder 1204. Thus, the light emitted from the LED unit 1202 is emitted through the rod lens array 1203. The LED print head 1200 is used as an exposing unit for use in an electrophotographic printer and an electrophotographic copier.

As described above, a composite semiconductor device described in the first to sixth embodiments is used as the light source in the LED unit 1202. Thus, the LED unit 1202 provides a highly reliable LED head.

Eighth Embodiment

Figure 40:
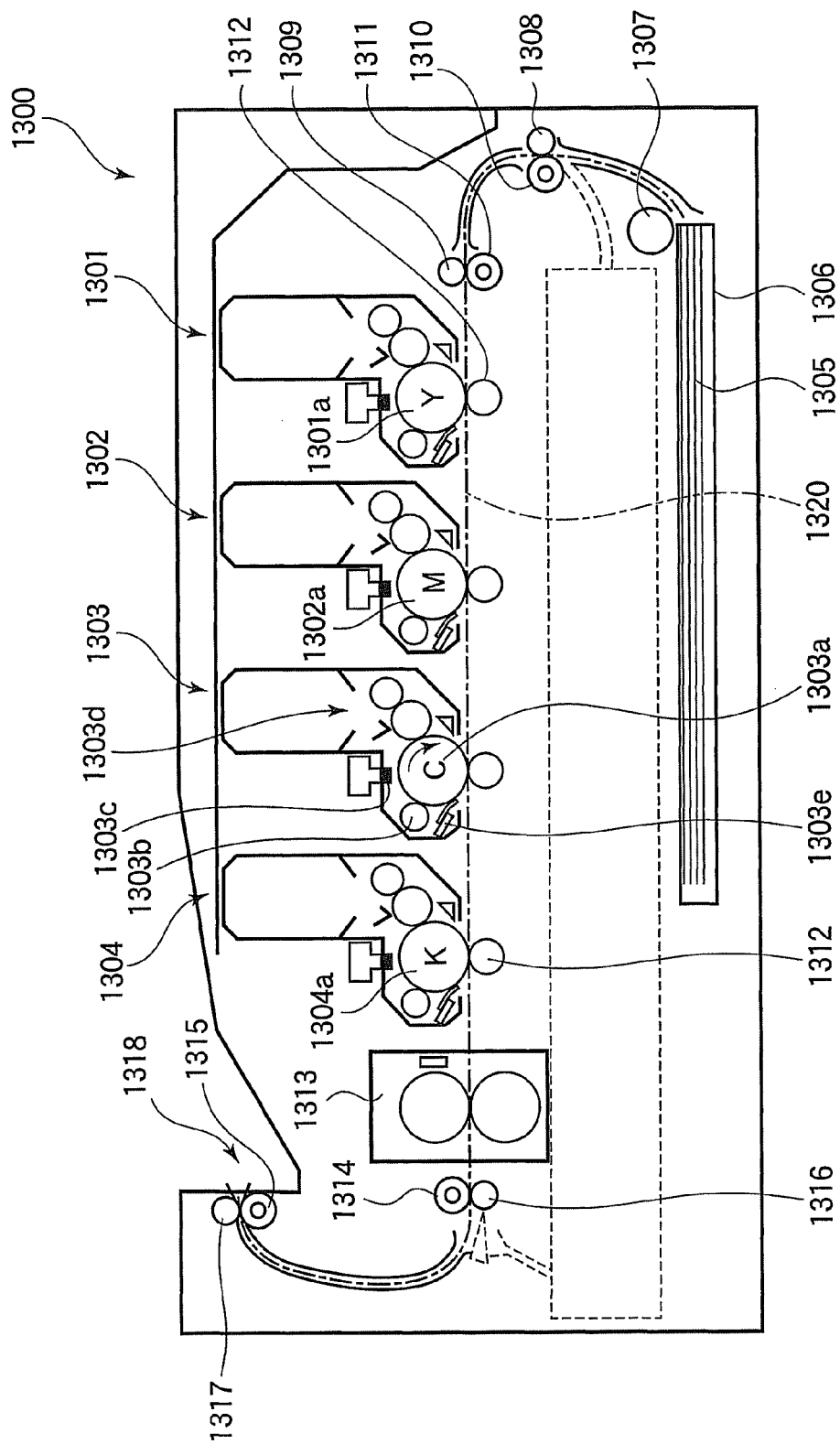
FIG. 40 illustrates a pertinent portion of an image forming apparatus of an eighth embodiment.

FIG. 40 illustrates a pertinent portion of an image forming apparatus 1300 of an eighth embodiment.

Referring to FIG. 40, the image forming apparatus 1300 incorporates process units 1301-1304 that form yellow, magenta, cyan, and black images, respectively. The process units 1301-1304 are aligned from upstream to downstream along a transport path 1320 of a recording medium 1305. Each process unit may be substantially identical; for simplicity only the operation of the cyan process unit 1303 will be described, it being understood that the other may work in a similar fashion.

The process unit 1303 includes a photosensitive drum 1303a rotatable in a direction shown by an arrow. A charging unit 1303b charges the surface of the photosensitive drum 1303a. An exposing unit 1303c illuminates the charged surface of the photosensitive drum 1303a to form an electrostatic latent image. A developing unit 1303d supplies cyan toner to the electrostatic latent image to form a visible image. A cleaning unit 1303e removes the toner adhering to the surface of the photosensitive drum 1303a. The rollers in these units disposed around the photosensitive drum 1303a are driven in rotation by drive sources and gears (not shown).

A paper cassette 1306 holds a stack of recording medium 1305 such as paper. A hopping roller 1307 feeds the recording medium 1305 on a sheet-by-sheet basis. Registration rollers 1310 and 1311 are disposed downstream of the hopping roller 1307, correct the skew of the recording medium 1305, and advance the recording medium 1305 in timed relation with image formation in the process unit. The hopping roller 1307, registration rollers 1310 and 1311 are driven in rotation by a drive source and gears (not shown).

Transfer rollers 1312 are formed of a semiconductive rubber material, and are disposed to parallel the photosensitive drums in the process units 1301-1304. A high voltage is applied to the transfer rollers 1312 to develop a potential difference between the photosensitive drums and corresponding transfer rollers 1312, thereby transferring the visible images (toner image) from the photosensitive drums onto the recording medium 1305.

A fixing unit 313 includes a heat roller and a pressure roller in contact with the heat roller to define a fixing point between them. The toner image is fused into a permanent image. The recording medium 1305 is then transferred by discharging rollers 1314 and 1315 and pinch rollers 1316 and 1317. The discharging rollers 1314 and 1315 are driven in rotation by a drive source and gears (not shown) in an interlocked manner. The exposing unit 1302*e* employs the LED print head 1200 of the seventh embodiment.

The operation of the image forming apparatus of the aforementioned configuration will be described. The hopping roller 1307 feeds the recording medium 1305 on a page-by-page basis The registration roller 1310 and 1311 cooperate with pinch rollers 1308 and 1309 to transport the recording medium 1305 to the process unit 1301. Then, the recording medium 1305 is transported through the process unit 1301.

The recording medium 1305 passes through the process units 1302-1304 in sequence so that toner images of the respective colors are transferred onto the recording medium 1350 in registration. As the recording medium passes through the fixing unit 1313, the toner images of the respective colors are fused to form a full color permanent image. Then, the discharging roller 1314 and 1315 cooperate with the pinch rollers 1316 and 1317 to discharge the recording medium 1305 onto the stacker 1318. As described above, employing the LED print head of the seventh embodiment provides a small-size, reliable image forming apparatus.

While the first to sixth embodiments have been described in terms of an LED array as a semiconductor element for a composite semiconductor device, the invention may also be applicable to other semiconductor elements than LED arrays, for example, a light receiving element.

What is claimed is:

1. A composite semiconductor device, comprising:
   a substrate;
   a plurality of circuits formed on said substrate;
   one or more wiring layers, each including a plurality of wiring patterns connected to circuits of the plurality of circuits, a plurality of dummy patterns electrically isolated from the plurality of circuits, and an interlayer dielectric film that is spin-coated directly onto the wiring patterns and onto the dummy patterns, and that is a spin-coated layer, the dummy patterns being formed in areas where the plurality of wiring patterns are absent and lying substantially in a plane in which the wiring patterns lie; and
   a semiconductor thin film layer that includes semiconductor device elements and that is disposed on an upper most surface of the one or more wiring layers wherein the plurality of the wiring patterns, the interlayer dielectric thin film, and the plurality of dummy patterns have respective thicknesses, wherein a thickness is the thickness of the plurality of wiring patterns plus the thickness of the interlayer dielectric thin film on the plurality of wiring patterns in each wiring layer of the one or more wiring layers, a second thickness is the thickness of the interlayer dielectric thin film at the areas where the plurality of wiring patterns are not formed in each wiring layer of the one or more wiring layers; and wherein the thickness of the plurality of dummy patterns is substantially equal to a difference between the first thickness and the second thickness.

2. The composite semiconductor device according to claim 1, wherein the spin-coated layer is formed of an organic material.

3. The composite semiconductor device according to claim 1, wherein the spin-coated layer is formed of an oxide material.

4. The composite semiconductor device according to claim 1, wherein the plurality of dummy patterns is formed as a plurality of individual island structures.

5. The composite semiconductor device according to claim 1, wherein the plurality of dummy patterns and the plurality of wiring patterns have respective thicknesses that are substantially equal.

6. The composite semiconductor device according to claim 4, wherein the plurality of dummy patterns has a thickness, and wherein the plurality of dummy patterns are disposed such that a distance between adjacent dummy patterns of the plurality of dummy patterns is not longer than the thickness of the plurality of dummy patterns.

7. The composite semiconductor device according to claim 4, wherein the plurality of dummy patterns has a thickness and wherein the plurality of dummy patterns is disposed such that a distance between adjacent dummy patterns of the plurality of dummy patterns is not longer than or equal to 1 μm.

8. The composite semiconductor device according to claim 4, wherein the plurality of dummy patterns includes square patterns and rectangular patterns.

9. The composite semiconductor device according to claim 4, wherein the plurality of dummy patterns has a plurality of sizes, and wherein the plurality of dummy patterns is disposed such that a distance between adjacent dummy patterns of the plurality of dummy patterns is one of a plurality of distances.

10. The composite semiconductor device according to claim 1, wherein a non-patterned layer is formed in a region at least in one of the one or more wiring layers.

11. The composite semiconductor device according to claim 1, wherein the one or more wiring layers inch ides an uppermost layer, and wherein a non-patterned layer is formed on the uppermost layer of the one or more wiring layers.

12. The composite semiconductor device according to claim 1, wherein the plurality of dummy patterns has an upper surface and a lower surface wherein the semiconductor thin film layer is a plurality of semiconductor thin film layers formed on the upper surface and on the lower surface of the plurality of dummy patterns, and wherein the semiconductor thin film layer on the upper surface is formed of a material that is the same as that of the semiconductor thin film layer on the lower surface of the plurality of dummy patterns.

13. The composite semiconductor device according to claim 1, wherein said plurality of dummy patterns is formed adjacent to a region in which said plurality of circuits is formed.

14. The composite semiconductor device according to claim 1, wherein said semiconductor thin film layer is a plurality of semiconductor thin film layers.

15. The composite semiconductor device according to claim 1, wherein said semiconductor thin film layer is bonded to a layer having a surface roughness that is not greater than or equal to 10 nm.

16. The composite semiconductor device according to claim 1, wherein the one or more wiring layers have an uppermost layer, and wherein the uppermost layer of the one or more wiring layers below said semiconductor thin film layer has a surface roughness of not greater than or equal to 200 nm.

17. The composite semiconductor device according to claim 1, wherein said substrate is formed of a single crystal of Si.

18. The composite semiconductor device according to claim 17, wherein said plurality of circuits includes semiconductor circuit elements formed in the single crystal of Si.

19. The composite semiconductor device according to claim 1, wherein said semiconductor thin film layer includes a compound semiconductor material.

20. The composite semiconductor device according to claim 1, wherein said semiconductor thin film layer includes a material formed of single crystal Si.

21. The composite semiconductor device according to claim 19, wherein said semiconductor thin film layer is formed of a plurality of materials.

22. The composite semiconductor device according to claim 20, wherein said semiconductor thin film layer is formed of a plurality of materials.

23. The composite semiconductor device according to claim 1, wherein said substrate is formed of an insulating material.

24. The composite semiconductor device according to claim 23, wherein the insulating material is either glass or ceramic.

25. The composite semiconductor device according to claim 1, wherein said substrate is formed of a metal.

26. The composite semiconductor device according to claim 1, wherein said plurality of circuits is formed of one or more materials selected from the group consisting of amorphous Si, polysilicon Si, and an organic material.

* * * * *